(12) United States Patent
Yuasa et al.

(10) Patent No.: US 8,901,013 B2
(45) Date of Patent: Dec. 2, 2014

(54) SUBSTRATE PROCESSING APPARATUS, METHOD OF PROCESSING SUBSTRATE AND METHOD OF MANUFACTURING SEMICONDUCTOR DEVICE

(75) Inventors: Kazuhiro Yuasa, Takaoka (JP); Masanao Fukuda, Toyama (JP); Takafumi Sasaki, Toyama (JP); Yasuhiro Megawa, Toyama (JP); Masayoshi Minami, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 167 days.

(21) Appl. No.: 13/813,493

(22) PCT Filed: Aug. 2, 2011

(86) PCT No.: PCT/JP2011/067667
§ 371 (c)(1),
(2), (4) Date: Feb. 28, 2013

(87) PCT Pub. No.: WO2012/018008
PCT Pub. Date: Feb. 9, 2012

(65) Prior Publication Data
US 2013/0157474 A1  Jun. 20, 2013

(30) Foreign Application Priority Data
Aug. 5, 2010 (JP) ................ 2010-176197

(51) Int. Cl.
*H01L 21/02* (2006.01)
*H01L 21/3105* (2006.01)
*H01L 21/67* (2006.01)

(52) U.S. Cl.
CPC ...... *H01L 21/02104* (2013.01); *H01L 21/3105* (2013.01); *H01L 21/02238* (2013.01); *H01L 21/02255* (2013.01); *H01L 21/67017* (2013.01)
USPC .......................................... 438/758; 118/696

(58) Field of Classification Search
None
See application file for complete search history.

(56) References Cited

U.S. PATENT DOCUMENTS

| | | | |
|---|---|---|---|
| 5,777,300 A | 7/1998 | Homma et al. | |
| 6,410,456 B1 * | 6/2002 | Gronet et al. | 438/769 |
| 8,822,350 B2 * | 9/2014 | Yuasa et al. | 438/778 |
| 2004/0168638 A1 | 9/2004 | Ishii et al. | |
| 2008/0139001 A1 | 6/2008 | Watanabe et al. | |

FOREIGN PATENT DOCUMENTS

| | | |
|---|---|---|
| JP | A-62-128126 | 6/1987 |
| JP | A-7-142460 | 6/1995 |

(Continued)

OTHER PUBLICATIONS

Sep. 13, 2011 International Search Report issued in International Patent Application No. PCT/JP2011/067667 (with Translation).

*Primary Examiner* — Seahvosh Nikmanesh
(74) *Attorney, Agent, or Firm* — Oliff PLC

(57) ABSTRACT

An oxygen-containing gas and a hydrogen-containing gas are supplied into a pre-reaction chamber heated to a second temperature and having the pressure set to less than an atmospheric pressure, and a reaction is induced between both gases in the pre-reaction chamber to generate reactive species, and the reactive species are supplied into the process chamber and exhausted therefrom, in which a substrate heated to the first temperature is housed and the pressure is set to less than the atmospheric pressure, and processing is applied to the substrate by the reactive species, with the second temperature set to be not less than the first temperature at this time.

15 Claims, 13 Drawing Sheets

(56) References Cited

FOREIGN PATENT DOCUMENTS

| JP | A-10-98038 | 4/1998 |
| JP | A-2002-334867 | 11/2002 |
| JP | A-2008-140896 | 6/2008 |
| WO | WO 2005/020309 A1 | 3/2005 |

* cited by examiner

SUBSTRATE PROCESSING APPARATUS, METHOD OF PROCESSING SUBSTRATE AND METHOD OF MANUFACTURING SEMICONDUCTOR DEVICE

TECHNICAL FIELD

The present invention relates to a substrate processing apparatus that applies oxidation treatment or annealing, etc., to a substrate, a method of processing a substrate including processing a substrate using the substrate processing apparatus, and a method of manufacturing a semiconductor device.

DESCRIPTION OF RELATED ART

In a method of applying oxidation treatment to a substrate by introducing an oxygen gas and a hydrogen gas from each independently formed gas supply system, into a process chamber which is set in a decompressed atmosphere, a reaction between the gases and a silicon substrate is advanced before moisture is generated, and therefore a film formation rate at an initial time of oxidation is increased, and a difference in the film formation rate is small, in different plane orientations of the silicon substrate and on the surface of $Si_3N_4$. As a result, a difference in film thickness can be remarkably small, thus all owing an isotropic oxidation to occur (for example, see patent document 1).

PRIOR ART DOCUMENT

Patent Document

Patent document 1: International Publication WO 2005/020309 Pamphlet

SUMMARY OF THE INVENTION

Problem to be Solved by the Invention

A thermal oxide film on the silicon substrate formed using an oxidation technique (called simply isotropic oxidation hereafter) described in patent document 1, is excellent in an interfacial quality, and excellent in each kind of property of an oxide film. Therefore, such an oxidation technique is widely employed as one of key processes of a device requiring a high reliability, such as a tunnel oxide film forming process of a flash memory.

However, each kind of processing temperature needs to be decreased with a progress of a microfabrication in recent years, and if the processing temperature is decreased, there is an unavoidable problem that a film quality of the silicon oxide film is deteriorated even in a case of the isotropic oxidation. Also, as a processing temperature becomes lower, a film formation rate becomes lower. Therefore, a long processing time is required for obtaining the same film thickness, thus involving a problem such as a drop of productivity.

In each kind of a device using the microfabrication in which a lower temperature is required, the film quality and a silicon oxide film property equivalent to those of the silicon oxide film in a case of a high-temperature treatment, are required even if the processing temperature is a lower temperature. Accordingly, there is a necessity for providing a technique of improving the film formation rate and the film quality in a low-temperature treatment.

Accordingly, an object of the present invention is to provide a substrate processing apparatus, a method of processing a substrate, and a method of manufacturing a semiconductor device, capable of improving the film quality in the low-temperature treatment and increasing the film formation rate.

Means for Solving the Invention

According to an aspect of the present invention, there is provided a substrate processing apparatus, including:
a process chamber configured to house a substrate therein;
a first heating source configured to heat a substrate in the process chamber to a first temperature;
a pre-reaction chamber in which a reaction is induced among a plurality of kinds of gases;
a second heating source configured to heat the pre-reaction chamber to a second temperature;
an oxygen-containing gas supply system configured to supply an oxygen-containing gas into the pre-reaction chamber;
a hydrogen-containing gas supply system configured to supply a hydrogen-containing gas into the pre-reaction chamber;
a connection part configured to connect the pre-reaction chamber and the process chamber;
a pressure adjusting part configured to adjust a pressure in the process chamber and the pre-reaction chamber to a pressure of less than an atmospheric pressure; and
a control part configured to control the first heating source, the second heating source, the oxygen-containing gas supply system, the hydrogen-containing gas supply system, and the pressure adjusting part, so that the oxygen-containing gas and the hydrogen-containing gas are supplied into the pre-reaction chamber heated to the second temperature and having the pressure set to less than the atmospheric pressure, and a reaction is induced between both gases in the pre-reaction chamber to generate reactive species, and the reactive species are supplied into the process chamber in which a substrate heated to the first temperature is housed, and the pressure is set to less than the atmospheric pressure, and processing is applied to the substrate by the reactive species, with the second temperature set to be not less than the first temperature at this time.

According to other aspect of the present invention, there is provided a method of processing a substrate, including:
heating a substrate housed in a process chamber to a first temperature; and
supplying an oxygen-containing gas and a hydrogen-containing gas into a pre-reaction chamber heated to a second temperature being the temperature of not less than the first temperature and having a pressure set to less than an atmospheric pressure, and inducing a reaction between both gases in the pre-reaction chamber to generate reactive species, and supplying the reactive species into the process chamber in which the substrate heated to the first temperature is housed and the pressure is set to less than the atmospheric pressure, and applying processing to the substrate by the reactive species.

According to further other aspect of the present invention, there is provided a method of manufacturing a semiconductor device, including:
heating a substrate housed in a process chamber to a first temperature; and
supplying an oxygen-containing gas and a hydrogen-containing gas into a pre-reaction chamber heated to a second temperature being the temperature of not less than the first temperature and having a pressure set to less than an atmospheric pressure, and inducing a reaction between both gases in the pre-reaction chamber to generate reactive species, and supplying the reactive species into the process chamber in which the substrate heated to the first temperature is housed and the pressure is set to less than the atmospheric pressure, and applying processing to the substrate by the reactive species.

According to the present invention, there are provided the substrate processing apparatus, the method of processing a substrate, and a method of manufacturing a semiconductor device, capable of improving the film quality in a low-temperature treatment, and increasing a film formation rate.

BRIEF DESCRIPTION OF THE DRAWINGS

FIG. 6 is a schematic block diagram of a vertical-type processing furnace of a substrate processing apparatus suitably used in an embodiment of the present invention, wherein FIG. 6(a) is a view showing a processing furnace portion in a longitudinal sectional view, and FIG. 6(b) shows the processing furnace portion in a sectional view taken along the line A-A' of FIG. 6(a).

FIG. 11 is a schematic block diagram of the vertical-type processing furnace of the substrate processing apparatus according to a fifth modified example of an embodiment of the present invention, wherein FIG. 11(a) is a view showing the processing furnace portion in a longitudinal sectional view, and FIG. 11(b) is a view showing the processing furnace portion in a sectional view taken along the line A-A' of FIG. 11(a).

FIG. 14 is a schematic block diagram of the processing furnace of the substrate processing apparatus according to an eighth modified example of an embodiment of the present invention, wherein FIG. 14(a) is a view showing a case of directly connecting the pre-reaction chamber and the process chamber according to the third modified example, and FIG. 14(b) is a view showing a case of directly connecting the pre-reaction chamber and the process chamber according to the sixth modified example, and FIG. 14(c) is a view showing a case of directly connecting the pre-reaction chamber and the process chamber according to the seventh modified example.

MODE FOR CARRYING OUT THE INVENTION

Figure 1:
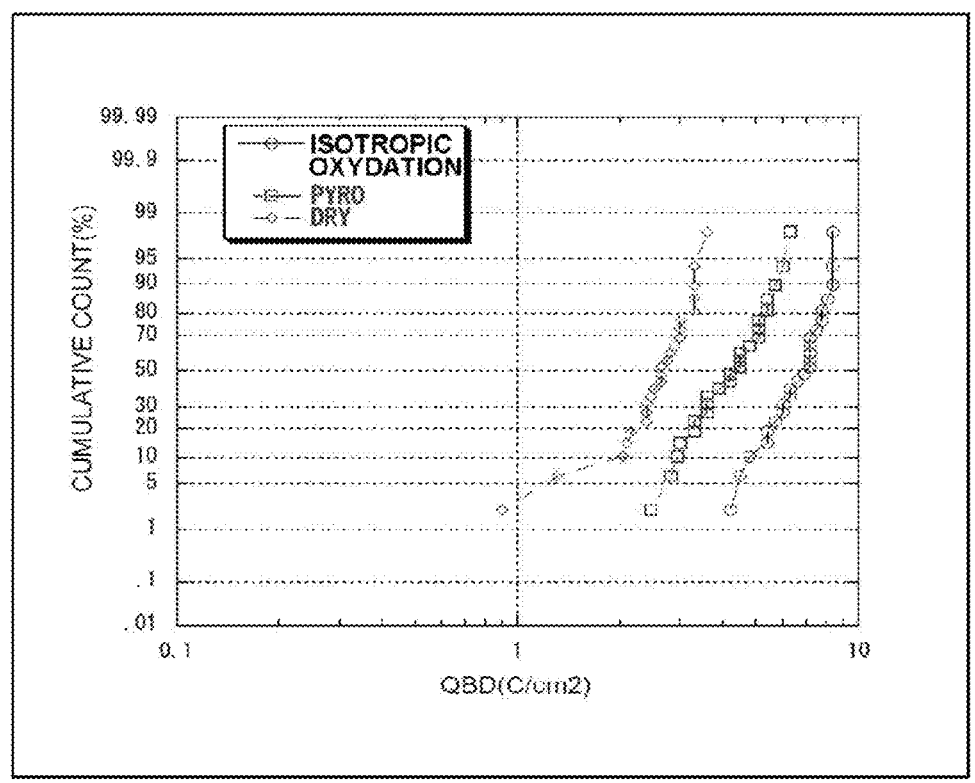
FIG. 1 is a view showing a dielectric strength characteristic of a silicon oxide film obtained by oxidation by "DRY", oxidation by "PYRO", and isotropic oxidation respectively.

First, a preliminary experiment performed by inventors of the present invention will be described. The inventors of the present invention measure an dielectric strength characteristic of a silicon oxide film obtained by a conventional technique such as dry oxidation or PYRO oxidation, etc., and a silicon oxide film obtained by isotropic oxidation. FIG. 1 shows an example of the dielectric strength characteristic of the silicon oxide film obtained by the oxidation by "DRY", oxidation by "PYRO", and isotropic oxidation respectively. In FIG. 1, electric charge to breakdown (QBD ($C/cm^2$)) is taken on the horizontal axis, and a cumulative failure rate (CUMULATIVE COUNT (%)) is taken on the vertical axis. It is found from FIG. 1 that the dielectric strength of the silicon oxide film obtained by the isotropic oxidation is not less than the dielectric strength of the silicon oxide film obtained by a conventional oxidation technique (dry oxidation and PYRO oxidation).

Figure 2:
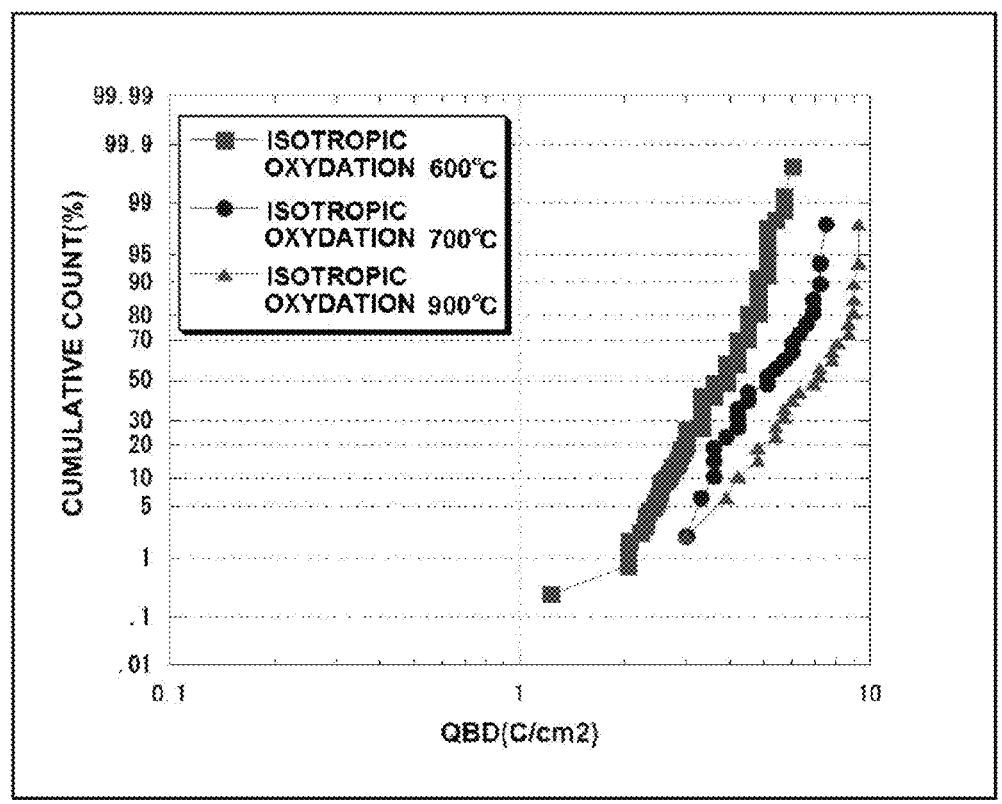
FIG. 2 is a view showing the dielectric strength characteristic of the silicon oxide film formed at a processing temperature of the isotropic oxidation at each processing temperature.

Further, the inventors of the present invention form the silicon oxide film by the isotropic oxidation with a processing temperature varied, and measure the dielectric strength characteristic of the silicon oxide film formed at each processing temperature. FIG. 2 shows a processing temperature for the isotropic oxidation, and the dielectric strength characteristic of the silicon oxide film formed at each processing temperature. In FIG. 2, the electric charge to breakdown (QBD ($C/cm^2$)) is taken on the horizontal axis, and the cumulative failure rate (CUMULATIVE COUNT (%)) is taken on the vertical axis. It is found from FIG. 2, that the dielectric strength of the silicon oxide film is deteriorated and the film quality is deteriorated, as the processing temperature becomes lower.

Figure 3:
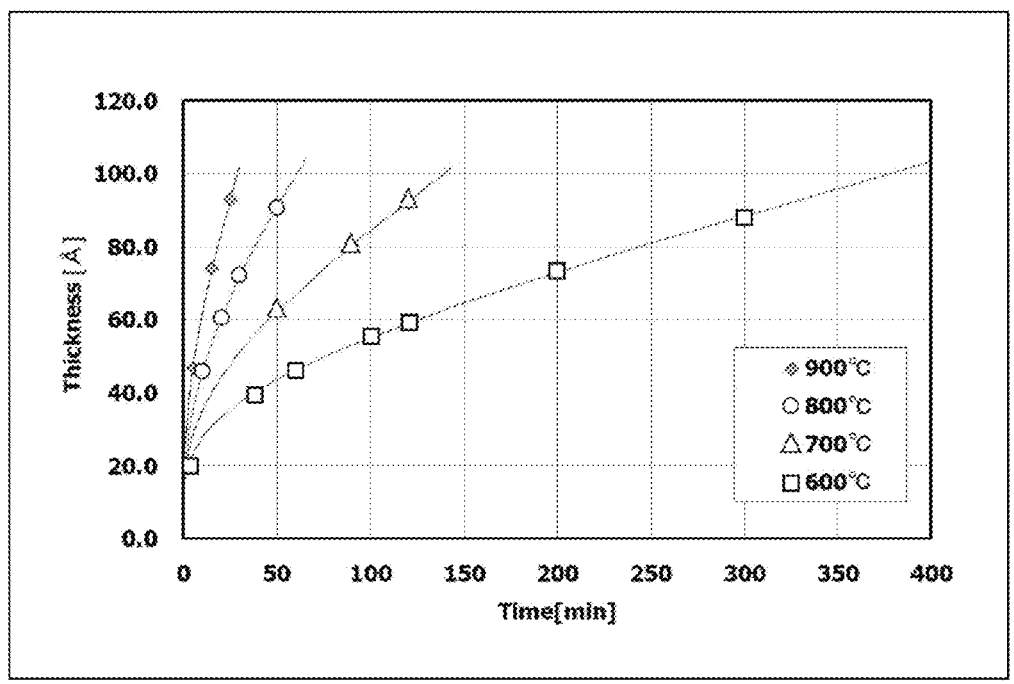
FIG. 3 is a view showing a relation between a processing time and a film thickness of the silicon oxide film at each processing temperature.

Further, the inventors of the present invention form the silicon oxide film by the isotropic oxidation with the processing temperature varied, and measure the film thickness of the silicon oxide film when a processing time is varied in each case. FIG. 3 shows a relation between the processing time and the film thickness of the silicon oxide film at each processing temperature. In FIG. 3, the processing time, "time (min)" is taken on the horizontal axis, and the film thickness of the silicon oxide film, "Thickness (A)" is taken on the vertical axis. It is found from FIG. 3, that as the processing temperature becomes lower, the film formation rate becomes lower. Therefore, as the temperature is decreased, a long processing time is required for obtaining the same film thickness, thus involving a problem such as a drop of productivity.

Figure 4:
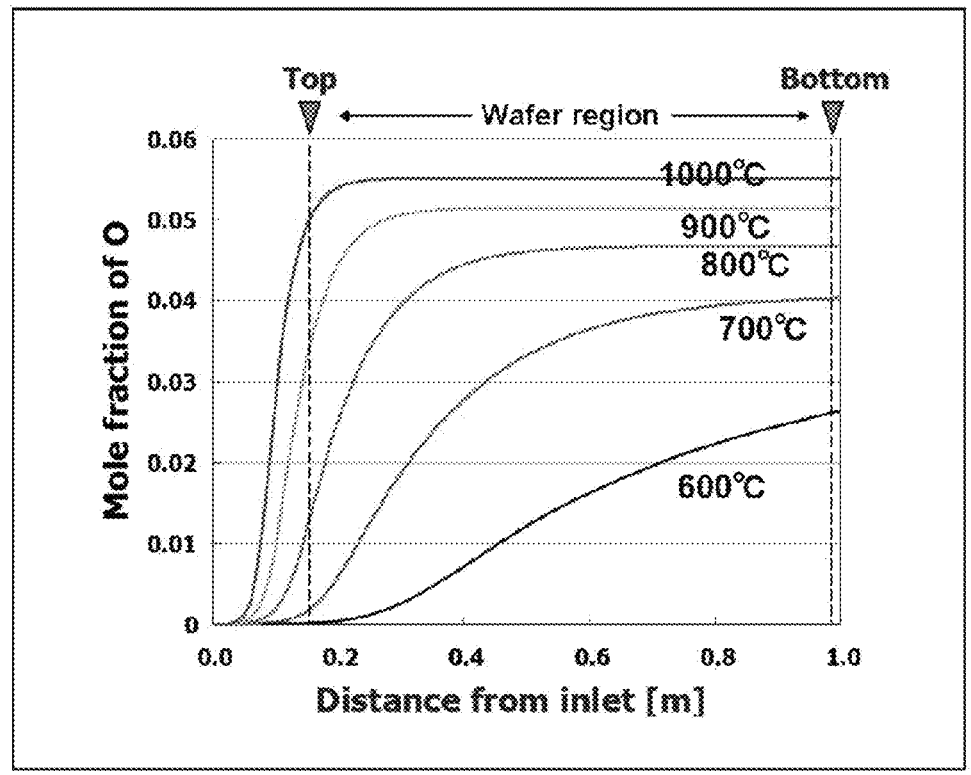
FIG. 4 is a view showing a relation between a generation amount of atomic oxygen in a process chamber and a temperature in the process chamber.

Further, the inventors of the present invention obtain a relation between a generation amount of atomic oxygen (O) being reactive species generated when an oxygen gas and a hydrogen gas are introduced into the process chamber which is set in a heated decompressed atmosphere, based on a CFD (Computational Fluid Dynamics) analysis. FIG. 4 shows a result of the CFD analysis. A distance from an inlet (gas supply port) which is a gas residence time is taken on the horizontal axis, and a molar fraction of the atomic oxygen (O), "mole fraction" is taken on the vertical axis.

It is found from FIG. 4, that when the temperature in the process chamber is high, a reaction rate is high, and a maximum generation amount of the atomic oxygen is obtained in a short time. Meanwhile, as the temperature in the process chamber is decreased, the reaction rate becomes low, and there is a little amount of generation of the atomic oxygen in the vicinity of an inlet of the process chamber, thus advancing a reaction toward a downstream side of a gas flow, and a delay is generated in the time required for obtaining a maximum generation amount of the atomic oxygen. The maximum generation amount of the atomic oxygen depends on the temperature in the process chamber, and the maximum generation amount of the atomic oxygen is relatively reduced in a low-temperature treatment. Also, an oxidizing power depends on the generation amount of the atomic oxygen, and therefore a film formation rate of the silicon oxide film is relatively low in the low-temperature treatment in which the maximum generation amount of the atomic oxygen is relatively reduced. This is indicated by an experiment result of FIG. 3.

As a result of strenuous efforts by the inventors of the present invention based on the result of these preliminary experiments, it is found that the atomic oxygen having a concentration equivalent to the concentration of the atomic oxygen being the reactive species obtained when a high-temperature treatment is performed, can be supplied to a reaction chamber that houses a substrate therein, the subject which is a treatment target and needs to be subjected to the low-temperature treatment, by installing a pre-reaction chamber having a second heating source in a former stage of the reaction chamber (process chamber) having a first heating source for heating the substrate to a first temperature, and generating the atomic oxygen being the reactive species by introducing an oxygen-containing gas and a hydrogen-containing gas into the pre-reaction chamber in which a pressure is set to less than an atmospheric pressure and a temperature is heated by the second heating source to a second temperature which is not less than the first temperature. Thus, it is also found that even if the processing temperature becomes a lower temperature, the film quality and a silicon oxide film property equivalent to those of the silicon oxide film in a case of a high-temperature treatment, can be obtained, and even in a case of the low-temperature treatment, the film formation rate can be increased. The present invention is based on the above-mentioned knowledge found by the inventors of the present invention.

An embodiment of the present invention will be described hereafter, with reference to the drawings.

Figure 6:
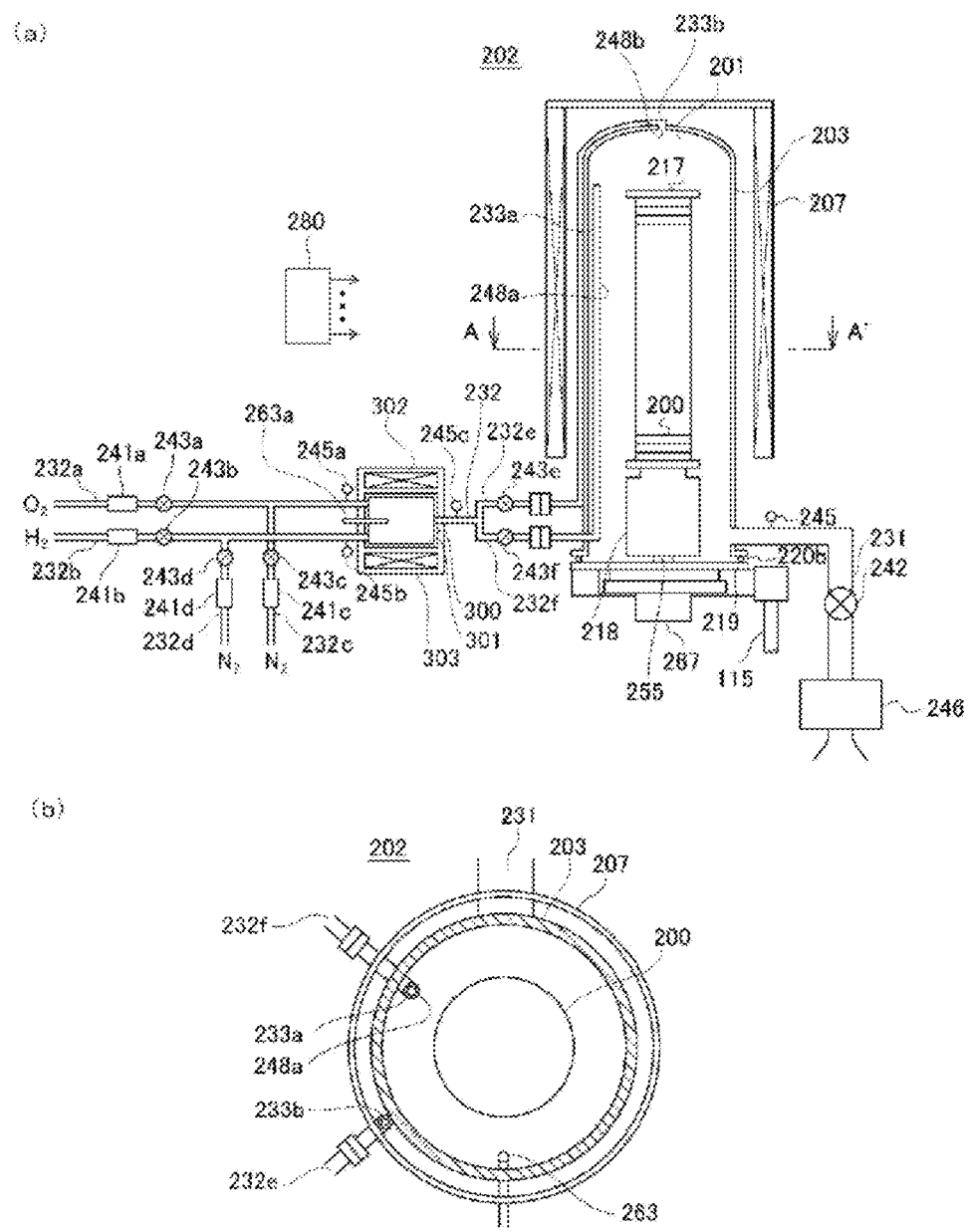

FIG. 6 is a schematic block diagram of a vertical-type processing furnace of a substrate processing apparatus suitably used in an embodiment of the present invention, wherein FIG. 6(a) is a view showing a processing furnace portion in a longitudinal sectional view, and FIG. 6(b) is a view showing the processing furnace portion in a sectional view taken along the line A-A' of FIG. 6(a).

As shown in FIG. 6, a processing furnace 202 has a first heater 207 as a first heating source (first heating unit). The first heater 207 is formed into a cylindrical shape, and is vertically installed on a heater base (not shown) by being supported by the heater base as a supporting plate. The first heater 207 is a resistance heating type heater (heating source by resistance-heating), and is configured to heat a wafer 200 in a process chamber 201 as described later, to a first temperature.

A process tube 203 as a reaction tube is arranged inside of the first heater 207 concentrically with the first heater 207. The process tube 203 is made of a heat-resistant material such as quartz ($SiO_2$) and silicon carbide (SiC), etc., and is formed into a cylindrical shape with an upper end closed and a lower end opened. The process chamber (reaction chamber) 201 is formed in a cylinder hollow part of the process tube 203, and is configured to house the wafer 200 as a substrate by a boat 217 as will be described later in a state of being arranged in a horizontal posture vertically in multiple stages. A reaction vessel (processing container) is formed by the process tube 203.

A first nozzle 233a as a first gas inlet part is provided in the process tube 203 so as to pass through a side wall in a lower part of the process tube 203. The first nozzle 233a is provided in an arc-shaped space between the inner wall of the process tube 203 constituting the process chamber 201 and the wafers 200, so as to rise upward in a stacking direction of wafers 200 along an inner wall of the process tube 203 from a lower part to an upper part. Gas supply holes 248a being supply holes for supplying a gas are provided on a side face of the first nozzle 233a. Each gas supply hole 248a is provided having the same opening area respectively extending from the lower part to the upper part, at the same opening pitch. A reaction gas supply tube 232f is connected to the first nozzle 233a.

In addition, a second nozzle 233b as a second gas inlet part is provided on a ceiling part namely a ceiling wall of the process tube 203. A reaction gas supply tube 232e is connected to the second nozzle 233b. The second nozzle 233b is provided along an outer wall of the process tube 203 extending from a lower part to a top part, and is communicated with an inside of the process chamber 201 at the top part. A gas supply hole 248b being a supply hole for supplying a gas, is provided on a tip portion (a downstream end portion) of the second nozzle 233b. The gas supply hole 248b is opened downward in the stacking direction of the wafers 200 in the process chamber 201.

Valves 243e, 243f being open/close valves are respectively provided on the reaction gas supply tubes 232e, 232f. The reaction gas supply tubes 232e, 232f are connected to the reaction gas supply tube 232 on its upstream side. Namely, the reaction gas supply tube 232 is configured to be branched to the reaction gas supply tubes 232e, 232f on its downstream side. A pre-reaction vessel 300 constituting a pre-reaction chamber 301 as will be described later, is connected to the upstream side of the reaction gas supply tube 232. A pressure sensor 245c being a pressure detector (pressure detecting part) for detecting a pressure inside of the reaction gas supply tube 232 namely the pressure at a secondary side (downstream side) of the pre-reaction chamber 301, is provided in the vicinity of the pre-reaction chamber 301 of the reaction gas supply tube 232. A reaction gas supply system is mainly constituted of the reaction gas supply tubes 232, 232e, 232f, and the valves 243e, 243f. Further, a piping part (communication part) as a connection part for connecting the pre-reaction chamber 301 and the process chamber 201, and communicating both chambers, is constituted of the reaction gas supply tubes 232, 232e, 232f, and the nozzles 233a, 233b.

Then, a flow passage for flowing a gas from the pre-reaction chamber 301 to the process chamber 201, is formed by this piping part.

A first gas supply tube 232a and a second gas supply tube 232b are further connected to the pre-reaction vessel 300, so that two different gases can be supplied into the pre-reaction chamber 301 through the first gas supply tube 232a and the second gas supply tube 232b.

A mass flow controller 241a being a flow rate controller (flow rate control unit) and a valve 243a being an open/close valve are provided on the first gas supply tube 232a sequentially from an upstream direction. In addition, a first inert gas supply tube 232c for supplying an inert gas is connected to a downstream side of the valve 243a of the first gas supply tube 232a. A mass flow controller 241c being a flow rate controller (flow rate control unit) and a valve 243c being an open/close valve are provided on the first inert gas supply tube 232c sequentially from the upstream direction. The pre-reaction chamber 301 is connected to the tip portion (downstream end portion) of the first gas supply tube 232a. A pressure sensor 245a being a pressure detector (pressure detecting part) for detecting a pressure inside of the first gas supply tube 232a, namely the pressure at a primary side (upstream side) of the pre-reaction chamber 301, is provided in the vicinity of the pre-reaction chamber 301 at a downstream side of the connection part connected to the first inert gas supply tube 232c of the first gas supply tube 232a. A first gas supply system is mainly constituted of the first gas supply tube 232a, the mass flow controller 241a, and the valve 243a. A first inert gas supply system is mainly constituted of the first inert gas supply tube 232c, the mass flow controller 241c, and the valve 243c.

A mass flow controller 241b being a flow rate controller (flow rate control unit), and a valve 243b being an open/close valve are provided on the second gas supply tube 232b sequentially from the upstream direction. Also, the second inert gas supply tube 232d for supplying the inert gas is connected to the downstream side of the valve 243b of the second gas supply tube 232b. A mass flow controller 241d being a flow rate controller (flow rate control unit) and a valve 243d being an open/close valve are provided on the second inert gas supply tube 232d sequentially from the upstream direction. The pre-reaction chamber 301 is connected to the tip portion (downstream end portion) of the second gas supply tube 232b. In addition, a pressure sensor 245b as a pressure detector (pressure detecting part) for detecting a pressure inside of the second gas supply tube 232b, namely the pressure at a primary side (upstream side) of the pre-reaction chamber 301, is provided in the vicinity of the pre-reaction chamber 301 on a downstream side of the connection part connecting to the second inert gas supply tube 232d of the second gas supply tube 232b. A second gas supply system is mainly constituted of the second gas supply tube 232b, the mass flow controller 241b, and the valve 243b. A second inert gas supply system is mainly constituted of the second inert gas supply tube 232d, the mass flow controller 241d, and the valve 243d.

For example, an oxygen ($O_2$) gas is supplied into the pre-reaction chamber 301 from the first gas supply tube 232a, through the mass flow controller 241a and the valve 243a, as an oxidizing gas, namely the oxygen-containing gas. Namely, the first gas supply system is configured as an oxidizing gas supply system (oxygen-containing gas supply system). Simultaneously at this time, the inert gas may be supplied into the first gas supply tube 232a from the first inert gas supply tube 232c, through the mass flow controller 241c and the valve 243c.

For example, a hydrogen ($H_2$) gas is supplied into the pre-reaction chamber 301 from the second gas supply tube 232b, through the mass flow controller 241b and the valve 243b, as a reductive gas, namely, the hydrogen-containing gas. Namely, the second gas supply system is configured as a reductive gas supply system (hydrogen-containing gas supply system). Simultaneously at this time, the inert gas may be supplied into the second gas supply tube 232b from the second inert gas supply tube 232d through the mass flow controller 241d and the valve 243d.

The pre-reaction vessel 300 is made of a heat resistant material such as quartz ($SiO_2$) or silicon carbide (SIC), etc., for example, and is formed into a cylindrical shape. The pre-reaction chamber 301 is formed in a cylindrical hollow part of the pre-reaction vessel 300, and the pre-reaction chamber 301 is a chamber in which a reaction is induced in its inside, between the oxygen-containing gas and the hydrogen-containing gas. A plurality of inlets or two inlets here and one outlet are provided to the pre-reaction vessel 300. The above-mentioned first gas supply tube 232a and second gas supply tube 232b are respectively connected to each inlet of the pre-reaction vessel 300, so that the oxygen-containing gas and the hydrogen-containing gas can be supplied into the pre-reaction chamber 301. The above-mentioned reaction gas supply tube 232 is connected to the outlet of the pre-reaction vessel 300, so that the reactive species containing oxygen such as atomic oxygen (O), etc., generated by causing a reaction between the oxygen-containing gas and the hydrogen-containing gas in the pre-reaction chamber 301, can be supplied into the reaction gas supply tube 232. A second heater 302 being a second heating source (second heating unit) is provided around the pre-reaction vessel 300 so as to cover a cylindrical side face of the pre-reaction vessel 300. The second heater 302 has a cylindrical shape, and is provided concentrically with the pre-reaction vessel 300 which has also the cylindrical shape. The second heater 302 is configured to heat an inside of the pre-reaction chamber 301 to the second temperature which is not less than the first temperature. The second heater 302 is configured to be controlled independently of the first heater 207. In addition, a heat insulating member 302 is provided around the second heater 302 and the pre-reaction vessel 300.

As described above, pressure sensors 245a, 245b, and 245c are respectively provided in the vicinity of the pre-reaction chamber 301 of the first gas supply tube 232a, the second gas supply tube 232b, and the reaction gas supply tube 232. Also, as described above, the pressure sensors 245a and 245b are configured to detect the pressure at the primary side (upstream side) of the pre-reaction chamber 301, namely the pressure at the inlet side of the pre-reaction chamber 301, and the pressure sensor 245c is configured to detect the pressure at the secondary side (downstream side) of the pre-reaction chamber 301, namely the pressure at the outlet side of the pre-reaction chamber 301. During processing applied to the wafer 200, the pressure at the primary side of the pre-reaction chamber 301, and the pressure at the secondary side of the pre-reaction chamber 301 are monitored by the pressure sensors 245a, 245b, and 245c, and these sensors monitor whether the pressure in the pre-reaction chamber 301 is maintained to a specific pressure of less than the atmospheric pressure. At this time, the sensors also monitor whether the pressure in the piping part between the pre-reaction chamber 301 and the process chamber 201 is maintained to a specific pressure of less than the atmospheric pressure.

In order to monitor whether the pressure in the pre-reaction chamber 301, and the pressure in the piping part, are maintained to a specific pressure of less than the atmospheric pressure, at least the pressure at the secondary side of the pre-reaction chamber 301 may be monitored, and monitoring of the primary side pressure is not necessarily required. In this case, the pressure sensors 245a, 245b at the primary side of the pre-reaction chamber 301 may be omitted. However, by monitoring both the pressure at the primary side and the pressure at the secondary side of the pre-reaction chamber 301, the sensors can more surely monitor whether the pressure in the pre-reaction chamber 301 is maintained to a specific pressure of less than the atmospheric pressure, and a further proper amount of reactive species can be generated, and safety can be further increased.

An exhaust tube 231 for exhausting an atmosphere in the process chamber 201, is provided in a lower part of the process tube 203. An exhaust port is formed at a connection part between the process tube 203 and the exhaust tube 231. A vacuum pump 246 as a vacuum exhaust device, is connected to the exhaust tube 231, interposing a pressure sensor 245 as a pressure detector, and an APC (Auto Pressure Controller) valve 242 as a pressure adjuster. The APC valve 242 is an open/close valve configured to perform vacuum-exhaust/stop of vacuum-exhaust of the inside of the process chamber 201 by opening and closing the valve while operating the vacuum pump 246, and perform pressure adjustment of the inside of the process chamber 201 by adjusting a valve opening degree while operating the vacuum pump 246. With this structure, by adjusting the opening degree of the valve of the APC valve 242 based on the pressure information detected by the pressure sensor 245 while operating the vacuum pump 246, the vacuum exhaust can be performed so that the pressure in the process chamber 201 becomes a desired pressure (vacuum degree). An exhaust system is mainly constituted of the exhaust tube 231, the pressure sensor 245, the APC valve 242, and the vacuum pump 246.

During processing applied to the wafer 200, the opening degree of the APC valve 242 is adjusted based on the pressure information detected by the pressure sensor 245, and the pressure in the process chamber 201 is adjusted (controlled) to a specific pressure of less than the atmospheric pressure. At this time, the pressure in the pre-reaction chamber 301 is also adjusted to a specific pressure of less than the atmospheric pressure. Also, the pressure in the piping part between the pre-reaction chamber 301 and the process chamber 201 is adjusted to a specific pressure of less than the atmospheric pressure. At this time, as described above, the pressure at the primary side and the pressure at the secondary side of the pre-reaction chamber 301 are monitored by the pressure sensors 245a, 245b, and 245c, to thereby monitor whether the pressure in the pre-reaction chamber 301 and the pressure in the piping part are maintained to a specific pressure of less than the atmospheric pressure.

Here, when the pressure in the pre-reaction chamber 301 is maintained to a specific pressure of less than the atmospheric pressure, namely to a pressure of 3999 Pa or less, and preferably to a pressure of 2666 Pa or less, a reaction is induced between an $O_2$ gas and a $H_2$ gas under a temperature of 45° C. or more, and the reactive species such as atomic oxygen (O), etc., can be generated. Particularly, when the pressure in the pre-reaction chamber 301 is maintained to a pressure of 1333 Pa or less, a proper reaction is induced between the $O_2$ gas and the $H_2$ gas under the temperature of 450° C. or more for example, and the reactive species such as a proper amount of atomic oxygen (O), etc., can be generated without generating $H_2O$. A generation efficiency of the reactive species such as atomic oxygen (O), etc., is highest when the pressure in the pre-reaction chamber 301 is set to 1333 Pa or less, and is next-highest when the pressure in the pre-reaction chamber 301 is set to 2666 Pa or less, and is the next highest when the pressure in the pre-reaction chamber 301 is set to 3999 Pa or less, under the same temperature. Namely, the pressure in the pre-reaction chamber 301 is set to 3999 Pa or less, preferably to 2666 Pa or less, and further preferably to 1333 Pa or less. Further, under such pressures, even when a heat of 450° C. or more for example is added, there is a low reaction probability between the $O_2$ gas and the $H_2$ gas, and therefore heat supply is not performed by a reaction heat required for a chain reaction, thus absorbing a pressure variation caused by a local volume expansion. This makes it possible to avoid the reaction from an explosion range of a mixed gas of the $O_2$ gas and the $H_2$ gas.

Reversely, when the pressure in the pre-reaction chamber 301 exceeds 3999 Pa, the reaction between the $O_2$ gas and the $H_2$ gas is excessively advanced when a heat of 450° C. or more for example is added, thus generating relatively a large quantity of $H_2O$. Therefore, generation of the reactive species such as atomic oxygen (O), etc., is reduced, and the processing focusing on the reaction of the reactive species cannot be performed properly. Further, under a condition of the above-mentioned temperature and pressure, a risk of the explosion is generated depending on a $H_2/O_2$ ratio.

Therefore, in this embodiment, when the pressure in the pre-reaction chamber 301 is maintained to a specific pressure of less than the atmospheric pressure, namely, to the pressure of 3999 Pa (30 Torr) or less, the $H_2$ gas is allowed to be supplied into the pre-reaction chamber 301, and when the pressure in the pre-reaction chamber 301 is not maintained to the pressure of 3999 Pa or less, namely, exceeds 3999 Pa, the $H_2$ gas is not allowed to be supplied into the pre-reaction chamber 301.

For example, when the pressure in the pre-reaction chamber 301 exceeds 3999 Pa and the valve 243b is in a close state, the valve 243b is inhibited from an open state so as not to allow the $H_2$ gas to be supplied into the pre-reaction chamber 301. At this time, when the valve 243a is in a close state, the valve 243a may also be inhibited from an open state so as not to allow the $O_2$ gas to be supplied into the per-reaction chamber 301. Further, when the pressure in the pre-reaction chamber 301 exceeds 3999 Pa and the valve 243b is already in an open state, the valve 243b must be set in a close state and the supply of the $H_2$ gas into the pre-reaction chamber 301 is stopped, to thereby stop the processing to the wafer 200. At this time, when the valve 243a is already an open state, the valve 243a may also be set in a close state, so that the supply of the $O_2$ gas into the pre-reaction chamber 301 may be stopped. However, in this case, it can be considered that the reaction between the $H_2$ and $O_2$ falls within an explosion range depending on the $H_2/O_2$ ratio, and therefore timing of supply/stop of the $O_2$ gas needs to be properly adjusted by more delaying supply/stop of the $O_2$ gas than the supply/stop of the $H_2$ gas.

Meanwhile, when the pressure in the pre-reaction chamber 301 is maintained to the pressure of 3999 Pa or less, the valve 243b is maintained in an openable state, namely in a state that the $H_2$ gas can be supplied into the pre-reaction chamber 301. The same thing can be said for the valve 243a, which is maintained in an openable state, namely in a state that the $O_2$ gas can be supplied into the pre-reaction chamber 301.

Thus, in this embodiment, during processing applied to the wafer 200, the pressure in the pre-reaction chamber 301 is monitored using the pressure sensors 245a, 245b, and 245c, and only when the pressure in the pre-reaction chamber 301 is a specific pressure of less than the atmospheric pressure, the $H_2$ gas is allowed to be supplied into the pre-reaction chamber 301. In such a way, the pressure sensors 245a, 245b, and 245c are used as a trigger of an interlock. Such an interlock control is performed by a controller 280 as will be described later.

In addition, during processing applied to the wafer 200, when the APC valve 242 is feedback-controlled based on the pressure information detected by the pressure sensor 245, the pressure information detected by the pressure sensors 245a, 245b, and 245c may be taken into consideration. Namely, during processing applied to the wafer 200, the APC valve 242 is feedback-controlled based on the pressure information detected by the pressure sensors 245, 245a, 245b, and 245c, so that the pressure in the process chamber 201 becomes a specific pressure of less than the atmospheric pressure, and the pressure in the pre-reaction chamber 301 and the pressure in the piping part become a specific pressure of less than the atmospheric pressure. A pressure control part (pressure adjusting part) is mainly constituted of the pressure sensors 245, 245a, 245b, 245c, and the APC valve 242.

A seal cap 219 as a furnace throat lid member capable of air-tightly closing a lower end opening of the process tube 203, is provided in a lower part of the process tube 203. The seal cap 219 is configured to abut on a lower end of the process tube 203 from a vertically lower side. The seal cap 219 is made of a metal such as stainless, etc., for example, and is formed into a disc shape. An O-ring 220b is provided on an upper surface of the seal cap 219 as a seal member that abuts on the lower end of the process tube 203. A rotation mechanism 267 for rotating the boat 217 as a substrate holder described later, is installed on an opposite side of the process chamber 201 interposing the seal cap 219. A rotation axis 255 of the rotation mechanism 267 passes through the seal cap 219 and is connected to the boat 217. The rotation mechanism 267 is configured to rotate the wafer 200 by rotating the boat 217. The seal cap 219 is configured to be elevated vertically by a boat elevator 115 as an elevation mechanism installed vertically outside of the process tube 203. The boat elevator 115 is configured to load and unload the boat 217 into/from the process chamber 201 by elevating/descending the seal cap 219.

The boat 217 as a substrate holder is made of a heat resistant material such as quartz and silicon carbide, etc., for example, and is configured to support a plurality of wafers 200 in a horizontal posture, so as to be arranged in multiple stages, with centers aligned each other. A heat insulating member 218 made of a heat resistant material such as quartz and silicon carbide, etc., for example, is provided in a lower part of the boat 217, so that the heat from the first heater 207 is hardly transmitted to the seal cap 219 side. The heat insulating member 218 may also be constituted of a plurality of heat insulation boards made of the heat resistant material such as quartz and silicon carbide, etc., and an insulation board holder for supporting these heat insulation boards in a horizontal posture in multiple stages.

A temperature sensor 263 as a temperature detector is installed in the process tube 203, so that a desired temperature distribution is obtained in the process chamber 201 by adjusting a power supply state to the first heater 207 based on the temperature information detected by the temperature sensor 263. Similarly to the first nozzle 233a, the temperature sensor 263 is provided along the inner wail of the process tube 203. Also, the temperature sensor 263a as the temperature detector is installed in the pre-reaction chamber 301, so that a desired temperature distribution is obtained in the pre-reaction chamber 301 by adjusting a power supply state to the second heater 302 based on the temperature information detected by the temperature sensor 263a.

During processing applied to the wafer 200, the power supply state to the first heater 207 is adjusted based on the temperature information detected by the temperature sensor 263, to thereby control the temperature so that the temperature in the process chamber 201 and the temperature of the wafer 200 in the process chamber 201 are set to the first temperature. Also, the power supply state to the second heater 302 is adjusted based on the temperature information detected by the temperature sensor 263a, to thereby control the temperature so that the temperature in the pre-reaction chamber 301 is set to the second temperature which is not less than the first temperature.

Figure 15:
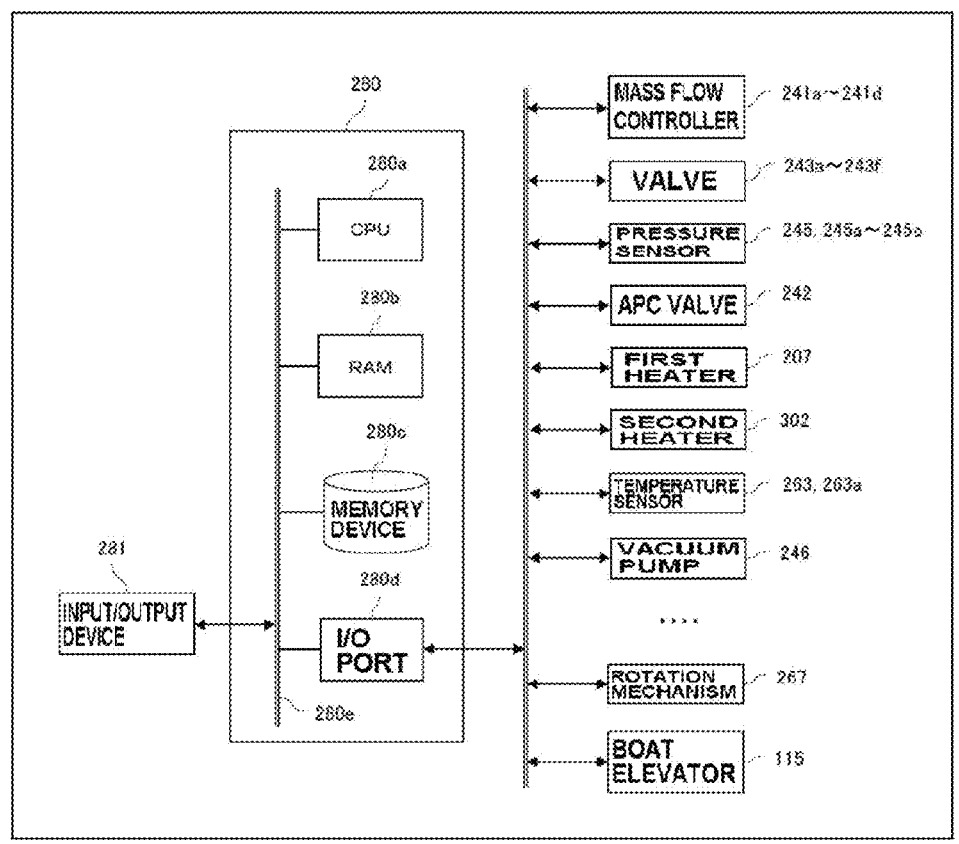
FIG. 15 is a schematic block diagram of a controller of the substrate processing apparatus suitably used in an embodiment of the present invention.

As shown in FIG. 15, the controller 280 being the control part (control unit) is constituted as a computer including a CPU (Central Processing Unit) 280a, a RAM (Random Access Memory) 280b, a memory device 280c, and an I/O port 280d. The RAM 280b, the memory device 280c, and the I/O port 280d are configured to allow data exchange, via an internal bus 280e. An input/output device 281 configured as a touch panel, etc., for example, is connected to the controller 280.

The memory device 280c is constituted of a flash memory and HDD (Hard Disk Drive), etc., for example. A control program for controlling an operation of a substrate processing apparatus, and a process recipe, etc., showing a procedure and a condition of substrate processing, are readably stored in the memory device 280c. Further, the RAM 280b is configured as a memory area (work area) in which the program and data, etc., read by the CPU 280a are temporarily stored.

The I/O port 280d is connected to the above-mentioned mass flow controllers 241a, 241b, 241c, 241d, valves 243a, 243b, 243c, 243d, 243e, 243f, pressure sensors 245, 245a, 245b, 245c, APC valve 242, first heater 207, second heater 302, temperature sensors 263, 263a, vacuum pump 246, rotation mechanism 267, and boat elevator 115, etc.

The CPU 280a is configured to read and execute the control program from the memory device 280c, and read the process recipe from the memory device 280c, based on an input, etc., of an operation command from the input/output device 281. Then, the CPU 280a is configured to control gas flow control by the mass flow controllers 241a, 241b, 241c, 241d, and open/close operation of the valves 243a, 243b, 243c, 243d, 243e, 243f, pressure monitoring by the pressure sensors 245, 245a, 245b, 245c, open/close operation of the APC valve 242, and a pressure adjustment based on the pressure sensor 245 by the APC valve 242, interlock operation based on the pressure sensor 245a, 245b, 245c, temperature adjustment by the first heater 207 based on the temperature sensor 263, temperature adjustment by the second heater 302 based on the temperature sensor 263a, start and stop of the vacuum pump 246, rotation speed adjustment by the rotation mechanism 267, and elevating operation of the boat 217 by the boat elevator 115.

The controller 280 is not limited to a structure as a dedicated computer, and may be configured as a general-purpose computer. For example, the controller 280 according to this embodiment can be configured by preparing a non-transitory computer-readable recording medium (such as a flexible disk and a CD-ROM, etc.) storing the above-mentioned program, and installing the program on the general-purpose computer using the non-transitory computer-readable recording medium. The unit for supplying the program to the computer is not limited to a case of supplying the program through the non-transitory computer-readable recording medium. For example, the program may be supplied by using a communication unit such as Internet or a dedicated line, not through the non-transitory computer-readable recording medium.

Next, explanation is given for an example of a method of applying oxidation treatment to the wafer 200, as a step of manufacturing a semiconductor device, using the processing furnace of the above-mentioned substrate processing apparatus. In the explanation hereafter, the operation of each part constituting the substrate processing apparatus is controlled by the controller 280.

When a plurality of wafers 200 are charged into the boat 217 (wafer charge), as shown in FIG. 6, the boat 217 supporting the plurality of wafers 200 is lifted by the boat elevator 115, and is loaded into the process chamber 201 (boat load). In this state, the lower end of the process tube 203 is set in a state of being sealed by the seal cap 219 through the O-ring 220b.

Subsequently, the inside of the process chamber 201 is vacuum-exhausted by the vacuum pump 246 so as to have a desired pressure of less than the atmospheric pressure. At this time, by opening the valves 243e, 243f of the reaction gas supply tubes 232e, 232f, the inside of the pre-reaction chamber 301 is also vacuum-exhausted by the vacuum pump 246 so as to have a desired pressure of less than the atmospheric pressure. Simultaneously, the inside of the piping part (inside of the reaction gas supply tubes 232, 232e, 232f and inside of the nozzles 233a, 233b) between the pre-reaction chamber 301 and the process chamber 201, is also vacuum-exhausted by the vacuum pump 246 so as to have a desired pressure of less than the atmospheric pressure. The inside of the pre-reaction chamber 301 is vacuum-exhausted through the reaction gas supply tubes 232, 232e, 232f, the nozzles 233b, 233a, the process chamber 201, and the exhaust tube 231. At this time, the pressure in the process chamber 201 is measured by the pressure sensor 245, and based on the measured pressure information, the APC valve 242 is feedback-controlled (pressure adjustment).

At this time, the pressure at the primary side and the pressure at the secondary side of the pre-reaction chamber 301 are monitored by the pressure sensors 245a, 245b, and 245c, and the sensors monitor whether the pressure in the pre-reaction chamber 301 and the pressure in the piping part are maintained to a specific pressure (pressure monitoring). Here, when the pressure in the pre-reaction chamber 301 is maintained to a specific pressure of less than the atmospheric pressure, namely to the pressure of 3999 Pa (30 Torr) or less, the $H_2$ gas is allowed to be supplied into the pre-reaction chamber 301. Meanwhile, when the pressure in the pre-reaction chamber 301 is not maintained to the pressure of 3999 Pa or less, namely when the pressure exceeds 3999 Pa, the interlock control is performed so as not allow the $H_2$ gas to be supplied into the pre-reaction chamber 301. The supply of the $O_2$ gas into the pre-reaction chamber 301 may also be similarly performed by the interlock control. Further, at this time, the APC valve 242 may be feedback-controlled based on the pressure information measured by the pressure sensors 245, 245a, 245b, and 245c. The pressure adjustment and the pressure monitoring are continuously performed until the processing to the wafer 200 is completed.

Further, the inside of the process chamber 201 and the wafer 200 in the process chamber 201 are heated to the first temperature by the first heater 207. At this time, the power supply state to the first heater 207 is feedback-controlled based on the temperature information detected by the temperature sensor 263, so that the inside of the process chamber 201 is set in a desired temperature distribution (temperature adjustment). Further at this time, the inside of the pre-reaction chamber 301 is heated by the second heater 302, to the second temperature which is not less than the first temperature. At this time, the power supply state to the second heater 302 is feedback-controlled based on the temperature information detected by the temperature sensor 263a so that the inside of the pre-reaction chamber 301 is set to a specific temperature.

Subsequently, the wafer 200 is rotated by rotating the boat 217 by the rotation mechanism 267. The rotation of the wafer 200 by rotating the boat 217, is continuously performed until the processing to the wafer 200 is completed.

Subsequently, the valve 243a of the first gas supply tube 232a is opened, to flow the $O_2$ gas to the first gas supply tube 232a. The $O_2$ gas flows through the first gas supply tube 232a, and the flow rate is adjusted by the mass flow controller 241. The $O_2$ gas with the flow rate adjusted, is supplied into the pre-reaction chamber 301 heated to the second temperature and set in a decompression state. At this time, simultaneously, the valve 243b of the second gas supply tube 232b is opened, to flow the $H_2$ gas to the second gas supply tube 232b. The $H_2$ gas flows through the second gas supply tube 232b, and the flow rate is adjusted by the mass flow controller 241b. The $H_2$ gas with the flow rate adjusted, is supplied into the pre-reaction chamber 301 heated to the second temperature and set in a decompression state. The $O_2$ gas and the $H_2$ gas are mixed in the pre-reaction chamber 301 heated to the second temperature and set in the decompression state (supply of the $O_2$ gas+$H_2$ gas).

At this time, it is also acceptable that the valve 243c of the first inert gas supply tube 232c is opened, to supply the $N_2$ gas as the inert gas through the first inert gas supply tube 232c. The $N_2$ gas is supplied into the first gas supply tube 232a, with the flow rate adjusted by the mass flow controller 241c. In this case, the mixed gas of the $O_2$ gas and the $N_2$ gas is supplied through the first gas supply tube 232a. Further, at this time, it is also acceptable that the valve 243d of the second inert gas supply tube 232d is opened, to supply the $N_2$ gas as the inert gas through the second inert gas supply tube 232d. The $N_2$ gas is supplied into the second gas supply tube 232b, with the flow rate adjusted by the mass flow controller 241d. In this case, the mixed gas of the $H_2$ gas and the $N_2$ gas is supplied through the second gas supply tube 232b. A rare gas such as Ar, He, Ne, Xe, etc., may also be used other than the $N_2$ gas, as the inert gas.

At this tire, the APC valve 242 is properly adjusted, to thereby maintain the pressure in the pre-reaction chamber 301 to a pressure of less than the atmospheric pressure, for example to a pressure in a range of 1 to 3999 Pa, and preferably to a pressure in a range of 1 to 2666 Pa, and further preferably to a pressure in a range of 1 to 1333 Pa. Further, the pressure in the piping part between the pre-reaction chamber 301 and the process chamber 201 is also maintained to the pressure of less than the atmospheric pressure, for example to the pressure in a range of 1 to 3999 pa, preferably in a range of 1 to 2666 Pa, and more preferably in a range of 1 to 1333 Pa. The supply flow rate of the $O_2$ gas controlled by the mass flow controller 241a, is set for example in a range of 100 to 10000 sccm (0.1 to 10 slm). The supply flow rate of the $H_2$ gas controlled by the mass flow controller 241b is set for example in a range of 100 to 10000 sccm (0.1 to 10 slm). At this time, concentration of the $H_2$ gas ($H_2/(O_2+H_2)$) is preferably set for example in a range of 0.05 to 0.5 (5 to 50%). Namely, a condition that the ratio of the $O_2$ gas is not less than the ratio of the $H_2$ gas; preferably a condition that the ratio of the $O_2$ gas is larger than the ratio of the $H_2$ gas; namely a condition of oxygen-rich, is preferable. Further, when the $N_2$ gas is supplied, the supply flow rate of the $N_2$ gas controlled by the mass flow controllers 241c, 241d, is set for example in a range of 200 to 1000 sccm (0.2 to 1 slm). The temperature of the second heater 302 is set so that the temperature in the pre-reaction chamber 301 becomes the second temperature, for example 400 to 1200° C., preferably 450 to 1100° C., and more preferably 600 to 1000° C.

By supplying the O$_2$ gas and the H$_2$ gas into the pre-reaction chamber 301 under the above-mentioned condition, the O$_2$ gas and the H$_2$ gas are thermally activated and reacted by non-plasma under a heated decompressed atmosphere, thereby generating the reactive species (oxidizing species) containing oxygen such as atomic oxygen (O), etc. (generation of the reactive species). Then, the reactive species generated in the pre-reaction chamber 301 are supplied from one end side (upper edge side) of a wafer arrangement region in the process chamber 201, and from a plurality of places of a region at a lateral side of the wafer arrangement region corresponding to the wafer arrangement region, through the reactive gas supply tubes 232, 232e, 232f, and the nozzles 233b and 233a, together with unreacted O$_2$ gas and H$_2$ gas, etc. The reactive species and unreacted O$_2$ gas and H$_2$ gas, etc., supplied into the process chamber 201, flow down in the process chamber 201 and are exhausted from the exhaust tube 231 through an exhaust port provided on the other end side (lower edge side) of the wafer arrangement region (supply of the reactive species).

At this time, the APC valve 242 is properly adjusted, to maintain the pressure in the process chamber 201 to the pressure of less than the atmospheric pressure, for example to the pressure in a range of 1 to 1333 Pa. The temperature of the first heater 207 is set so that the temperature in the process chamber 201 and the wafer 200 becomes the first temperature, for example the temperature in a range of the room temperature to 900° C., preferably the temperature in a range of 200 to 600° C. Note that the first temperature is set to be lower than the second temperature.

By supplying the reactive species such as atomic oxygen (O), etc., generated in the pre-reaction chamber 301, and unreacted O$_2$ gas and H$_2$ gas into the process chamber 201 under the above-mentioned condition, oxidation treatment is applied to the wafer 200 mainly by an action of the reactive species, thus forming a silicon oxide film (SiO$_2$ film) as an oxide film on the surface of the wafer 200. At least a part of the unreacted O$_2$ gas and H$_2$ gas supplied into the process chamber 201, is thermally activated in the process chamber 201 heated and set in the decompression atmosphere, thus similarly generating the reactive species such as atomic oxygen (O), etc., in the process chamber 201. Then, the reactive species generated in the process chamber 201 also contributes to the oxidation treatment to the wafer 200.

As the oxygen-containing gas, namely as the oxidizing gas, an ozone (O) gas, a nitric monoxide (NO) gas, and a nitrous oxide (N$_2$O) gas, etc., may be used other than the oxygen (O$_2$) gas. As the hydrogen-containing gas, namely as a reductive gas, a heavy hydrogen (D$_2$) gas, an ammonia (NH$_3$) gas, and a methane (CH$_4$) gas, etc., may be used other than the hydrogen (H$_2$) gas. Namely, at least one kind of gas selected from a group consisting of the O$_2$ gas, O$_3$ gas, NO gas, and N$_2$O gas, can be used as the oxygen-containing gas, and at least one kind of gas selected from a group consisting of the H$_2$ gas, D$_2$ gas, NH$_3$ gas, and methane CH$_4$ gas, can be used as the hydrogen-containing gas.

When the silicon oxide film having a specific film thickness is formed, the valves 243a, 243b are closed to stop the supply of the O$_2$ gas and the H$_2$ gas into the pre-reaction chamber 301, and stop the supply of the reactive species into the process chamber 201. Further, the valves 243c, 243d are opened, to supply the N$_2$ gas as the inert gas from each one of the first inert gas supply tube 232c and the second inert gas supply tube 232d, into the process chamber 201 through the pre-reaction chamber 301, and is exhausted through the exhaust tube 231. The N$_2$ gas acts as a purge gas, thereby purging the inside of the pre-reaction chamber 301 and the inside of the process chamber 201, and remove a gas remained in the pre-reaction chamber 301 and the process chamber 201 (purge). Thereafter, the atmosphere in the process chamber 201 is replaced by the inert gas, and the pressure in the process chamber 201 is returned to a normal pressure (return to the atmospheric pressure).

Thereafter, the seal cap 219 is descended by the boat elevator 115, and the lower end of the process tube 203 is opened, so that the processed wafers 200 are unloaded to outside of the process tube 203 from the lower end of the process tube 203 in a state that the processed wafers 200 are supported by the boat 217 (boat unload). Thereafter, the processed wafers 200 are discharged from the boat 217 (wafer discharge). Thus, a series of a process of applying the oxidation treatment to the wafer 200 is ended.

According to this embodiment, the temperature (second temperature) in the pre-reaction chamber 301 is set to be higher than the temperature (first temperature) of the wafer 200 in the process chamber 201. Therefore, the generation amount of the reactive species such as atomic oxygen, etc., obtained by the reaction between the O$_2$ gas and the H$_2$ gas, can be more increased than the generation amount of the reactive species obtained by directly supplying the O$_2$ gas and the H$_2$ gas into the process chamber 201 in which the wafer 200 is housed and the temperature is set to the first temperature being a relatively low temperature. Thus, the supply amount of the reactive species to the wafer 200 can be more increased than the supply amount of the reactive species when directly supplying the O$_2$ gas and the H$_2$ gas into the process chamber 201 in which the wafer 200 is housed and the temperature is set to the first temperature. Namely, in a state that the temperature of the wafer 200 is maintained to the first temperature being the relatively low temperature, the concentration of the reactive species in the process chamber 201 can be more increased than a case that the O$_2$ gas and the H$_2$ gas are directly supplied into the process chamber 201 in which the wafer 200 is housed and the temperature is maintained to the same temperature. Thus, a large amount of reactive species can be given to the wafer 200.

Further, according to this embodiment, the temperature (second temperature) in the pre-reaction chamber 301 is set to be higher than the temperature (first temperature) of the wafer 200 in the process chamber 201. Therefore, the generation amount of the reactive species such as atomic oxygen, etc., obtained by the reaction between the O$_2$ gas and the H$_2$ gas, can be set to be equivalent to the generation amount of the reactive species obtained by directly supplying the O$_2$ gas and the H$_2$ gas into the process chamber 201 in which the wafer 200 is housed and the temperature is set to the second temperature being a relatively high temperature. Thus, the supply amount of the reactive species to the wafer 200, can be equivalent to the supply amount of the reactive species to the wafer 200 when directly supplying the O$_2$ gas and the H$_2$ gas, into the process chamber 201 in which the wafer 200 is housed and the temperature is set to the second temperature. Namely, in a state that the temperature of the wafer 200 is maintained to the first temperature being a relatively low temperature, the reactive species can be given to the wafer 200, with an amount equivalent to a case of directly supplying the O$_2$ gas and the Hz gas into the process chamber 201 in which the wafer 200 is housed and the temperature is maintained to the second temperature being a relatively high temperature.

Thus, according to this embodiment, when a low-temperature treatment is applied to the wafer 200, the reactive species can be supplied to the wafer 200, with a concentration equivalent to the concentration of the reactive species obtained by applying a high-temperature treatment to the wafer 200, in a state that the temperature of the wafer 200 is maintained to a low temperature lower than a limit temperature in each kind of process. Thus, the film quality can be improved in the low-temperature treatment, similarly to the high-temperature treatment, and the film formation rate can also be improved similarly to the high-temperature treatment.

Further, according to this embodiment, during processing applied to the wafer 200, not only the pressure in the pre-reaction chamber 301 and the pressure in the process chamber 201, but also the pressure in the piping part between the pre-reaction chamber 301 and the process chamber 201, is maintained to the pressure of less than the atmospheric pressure. Thus, the reactive species such as atomic oxygen (O), etc., generated in the pre-reaction chamber 301 can be introduced into the process chamber 201 while suppressing a deactivation of the reactive species.

Further, an energy of the reactive species is not less than a bonding energy of Si—N, Si—Cl, Si—H, Si—C included in the silicon-containing substance such as the wafer 200 (single crystal silicon) or a polysilicon film or a silicon nitride film, etc., being objects to be oxidized. Therefore, by adding the energy of the reactive species to the silicon-containing substance being the object to be oxidized, bonds of Si—N, Si—Cl, Si—H, and Si—C are cut. N, H, Cl, C cut from the bond with Si, are removed from a film, and exhausted as $N_2$, $H_2$, $Cl_2$, HCl, and $CO_2$, etc. Also, a dangling bond of Si which is remained by cutting from the bonds with N, H, Cl, C, is bonded with O included in the reactive species, to thereby form a bond of Si—O. Thus, the silicon-containing substance is oxidized, to thereby form a silicon oxide film. Namely, according to the oxidation treatment of this embodiment, an extremely excellent silicon oxide film with extremely low concentration of nitrogen, hydrogen, chlorine, and carbon in the film, can be obtained.

(Application to the Annealing for the Purpose of Modifying Each Kind of Insulating Film)

In the above-mentioned embodiment, explanation is given for an example of applying the oxidation treatment to the wafer. However, the present invention can also be applied to a case that the annealing is performed, for the purpose of modifying the film quality of each kind of insulating film formed on the wafer. By this modification treatment, impurities in the film of each kind of insulating film can be removed, and the concentration of the impurities in the film can be considerably reduced. The modification treatment to each kind of insulating film, is mainly performed by an action of the reactive species such as atomic oxygen (O), etc., obtained by the reaction between the $O_2$ gas and the $H_2$ gas in the pre-reaction chamber which is heated and set in a decompressed atmosphere.

For example, the present invention can also be applied to a case of modifying the silicon oxide film ($SiO_2$ film) by applying the annealing to the silicon oxide film formed on the wafer, by a CVD (Chemical Vapor Deposition) method, or a MOCVD (Metal Organic Chemical Vapor Deposition) method, or an ALD (Atomic Layer Deposition) method. By this modification treatment, the impurities in the silicon oxide film can be removed, and the concentration of the impurities in the film can be considerably reduced. In this case as well, the reactive species with a concentration equivalent to the concentration of the reactive species obtained when being subjected to high-temperature treatment can be supplied to the silicon oxide film, in a state of maintaining the temperature of the wafer to a low temperature of not more than a limit temperature in each kind of process. Thus, in the low-temperature treatment, the film quality of the silicon oxide film can be improved similarly to the high-temperature treatment.

Further, for example, the present invention can also be applied to a case of modifying a high dielectric-constant insulating film, by applying the annealing to the high dielectric-constant insulating film (High-k film) formed on the wafer, by the CVD method or the MOCVD method or the ALD method. By this modification treatment, the impurities in the high dielectric-constant insulating film can be removed, thus considerably reducing the concentration of the impurities in the film. In this case as well, the reactive species can be supplied to the high dielectric-constant insulating film, with a concentration equivalent to the concentration of the reactive species obtained when high-temperature treatment is performed, in a state that the temperature of the wafer is maintained to a low temperature not more than a limit temperature in each kind of process. Thus, the film quality can be improved in the low-temperature treatment, similarly to the high-temperature treatment. As the high dielectric-constant insulating film, a metal oxide film including a metal element such as zirconium (Zr), hafnium (Hf), titanium (Ti), and aluminum (Al), etc., can be given. More specifically, for example there is a metal oxide such as a zirconium oxide film ($ZrO_2$ film), a hafnium oxide film ($HfO_2$ film), a titanium oxide film ($TiO_2$ film), and an aluminum oxide film ($Al_2O_3$ film), etc.

Thus, the present invention can be applied to a case of performing the annealing for the purpose of modifying not only a semiconductor oxide film containing a semiconductor element such as silicon (Si), but also each kind of the insulating film such as a metal oxide film containing zirconium (Zr), hafnium (Hf), titanium (Ti), and aluminum (Al), etc.

Processing conditions of the annealing applied to each kind of the insulating film, are as follows: Temperature in the pre-reaction chamber: 400 to 120° C., preferably 450 to 1100° C., more preferably 600 to 1000° C.; Pressure in the pre-reaction chamber: 1 to 3999 Pa, preferably 1 to 2666 Pa, and further preferably 1 to 1333 Pa $O_2$ gas supply flow rate: 100 to 10000 sccm (0.1 to 10 slm)
$H_2$ gas supply flow rate: 100 to 10000 sccm (0.1 to 10 slm),
$N_2$ gas supply flow rate: 200 to 1000 sccm (0.2 to 1 slm),
$H_2$ gas concentration ($H_2/(O_2+H_2)$): 0.05 to 0.5 (5 to 50%),
Wafer temperature: room temperature to 900° C., preferably 200 to 600° C.
Pressure in the process chamber: 1 to 1333 Pa In the annealing applied to each kind of the insulating film, as described above, the modification treatment of each kind of the insulating film is mainly performed by an action of the reactive species such as atomic oxygen (O), etc., generated in the pre-reaction chamber. Then, by this modification treatment, the impurities in the film of the each kind of the insulating film can be removed. According to this modification treatment, a significant effect of removing the impurities in the film can be obtained at a low temperature, compared with $O_2$ annealing or $N_2$ annealing performed as an ordinal modification treatment. Further, the reactive species can be supplied to each kind of the insulating film, with a concentration equivalent to the concentration of the reactive species obtained when high-temperature treatment is performed, in a state that the wafer temperature is maintained to a low temperature of not more than a limit temperature in each kind of the process. Thus, in the low-temperature treatment, the film quality of each kind of the insulating film can be improved similarly to the high-temperature treatment.

Energy of the reactive species is not less than a bonding energy of Si—N, Si—Cl, Si—H, Si—C, and a bonding energy of M-N, M-Cl, M-H, M-C, which are elements included in each kind of the insulating film, and therefore by giving the energy of the reactive species to each kind of the insulating film being an object to be annealed, bonds of Si—N, Si—Cl, Si—H, Si—C, and bonds of N—N, M-Cl, M-H, N—C are cut, which are elements included in each kind of the insulating film. Wherein, M indicates a metal element. N, H, Cl, C cut from the bonds of Si—N, N—H, Si—Cl, Si—C, are removed from the film, and exhausted as $N_2$, $H_2$, $Cl_2$, HCl, and $CO_2$, etc. Further, a dangling bond of Si or M remained by cutting from the bonds of N—N, N—H, Si—Cl, N—C, is bonded with O included in the reactive species, to thereby form a bond of Si—O or M-O. Further, at this time, each kind of the insulating film becomes tight. Thus, the modification treatment of each kind of the insulating film is performed. Namely, owing to the annealing, an excellent insulating film with extremely low nitrogen, hydrogen, chlorine, and carbon concentrations in the film, can be obtained.

An impurity removing effect of each kind of the insulating film by annealing is focused next. When the present invention is applied to the modification of the silicon oxide film, it is confirmed that particularly the H-concentration and the Cl concentration can be reduced in the impurities in the film. Meanwhile, when the present invention is applied to the modification of the metal oxide film, it is confirmed that particularly the H-concentration, the Cl-concentration, the C-concentration, and the N-concentration in the impurities in the film, can be reduced.

First Modified Example

Figure 7:
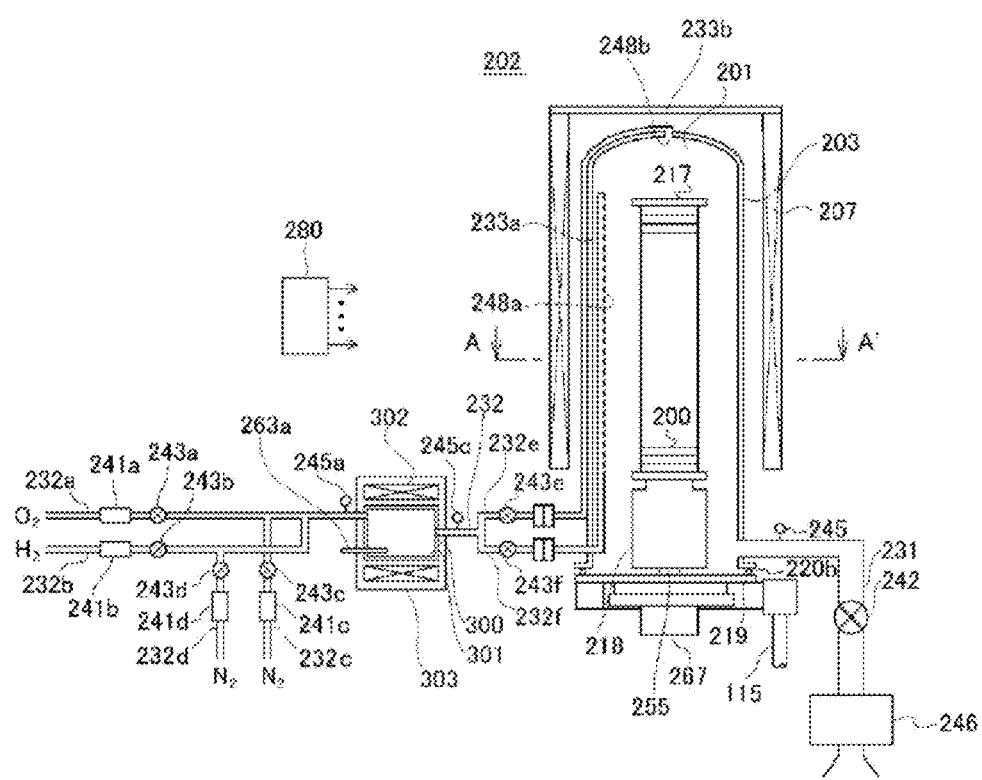
FIG. 7 is a schematic block diagram of the vertical-type processing furnace of the substrate processing apparatus according to a first modified example of an embodiment of the present invention, and is a view showing the processing furnace portion in a longitudinal sectional view.

Further, in the above-mentioned embodiment, explanation is given for a case that the first gas supply tube 232a for supplying the $O_2$ gas, and the second gas supply tube 232b for supplying the $H_2$ to the pre-reaction vessel 300 are connected to each other, to thereby supply the $O_2$ gas and the $H_2$ gas separately into the pre-reaction chamber 301. However, as shown in FIG. 7, according to the present invention, it is also acceptable that the first gas supply tube 232a for supplying the $O_2$ gas, and the second gas supply tube 232b for supplying the $H_2$ gas are joined, and this joined piping is connected to the pre-reaction chamber vessel 300, so that the $O_2$ gas and the $H_2$ gas are mixed in the joined piping beforehand, and the mixed gas is supplied into the pre-reaction chamber 301 (first modified example). In a case of the first modified example, one inlet and one outlet are provided in the pre-reaction vessel 300. The above-mentioned joined piping is connected to the inlet of the pre-reaction vessel 300, so that the mixed gas of the $O_2$ gas and the $H_2$ gas can be supplied into the pre-reaction chamber 301. In a case of the first modified example, one inlet is sufficient to be provided in the pre-reaction vessel 300 (the number of the inlet can be reduced), so that a structure of the pre-reaction vessel 300 can be simplified. Further, one pressure sensor is sufficient to be provided in the pre-reaction chamber 301 for detecting the pressure at the primary side (upstream side) of the pre-reaction chamber 301 (the number of the pressure sensor can be reduced), and a pressure control can be simplified. In the first modified example as well, an effect similar to the above-mentioned embodiment can be obtained. In FIG. 7, signs and numerals substantially same as those described in FIG. 6, are assigned, and explanation thereof is omitted.

Second Modified Example

Figure 8:
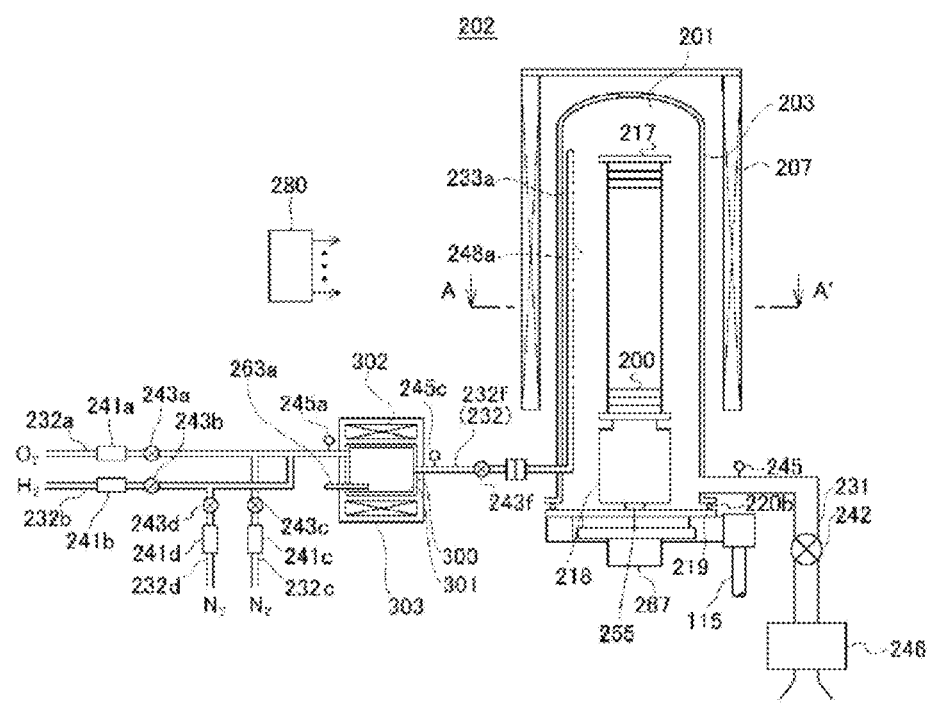
FIG. 8 is a schematic block diagram of the vertical-type processing furnace of the substrate processing apparatus according to a second modified example of an embodiment of the present invention, and is a view showing the processing furnace portion in a longitudinal sectional view.

Further, in the above-mentioned embodiment and first modified example, explanation is given for an example of supplying the reactive species generated in the pre-reaction chamber 301 into the process chamber 201 through both of the first nozzle 233a and the second nozzle 233b. However, it is also acceptable in the present invention, that the reactive species generated in the pre-reaction chamber 301 is supplied into the process chamber 201 through at least one of the first nozzle 233a and the second nozzle 233b. For example, when the reactive species generated in the pre-reaction chamber 301 is supplied into the process chamber 201 through the first nozzle 233a only, the valve 243e of the reaction gas supply tube 232e is closed, and the valve 243f of the reaction gas supply tube 232f is opened. In this case, as shown in FIG. 8, the second nozzle 233b, the reaction gas supply tube 232e, and the valve 243e may be omitted (second modified example). In a case of the second modified example, the structure of the gas inlet part can be simplified. The second modified example is obtained by further modifying the first modified example. In the second modified example as well, the effect similar to the effects of the above-mentioned embodiment and the first modified example can be obtained. In FIG. 8, signs and numerals substantially same as those described in FIG. 6 and FIG. 7, are assigned to the same element, and explanation thereof is omitted.

Third Modified Example

Figure 9:
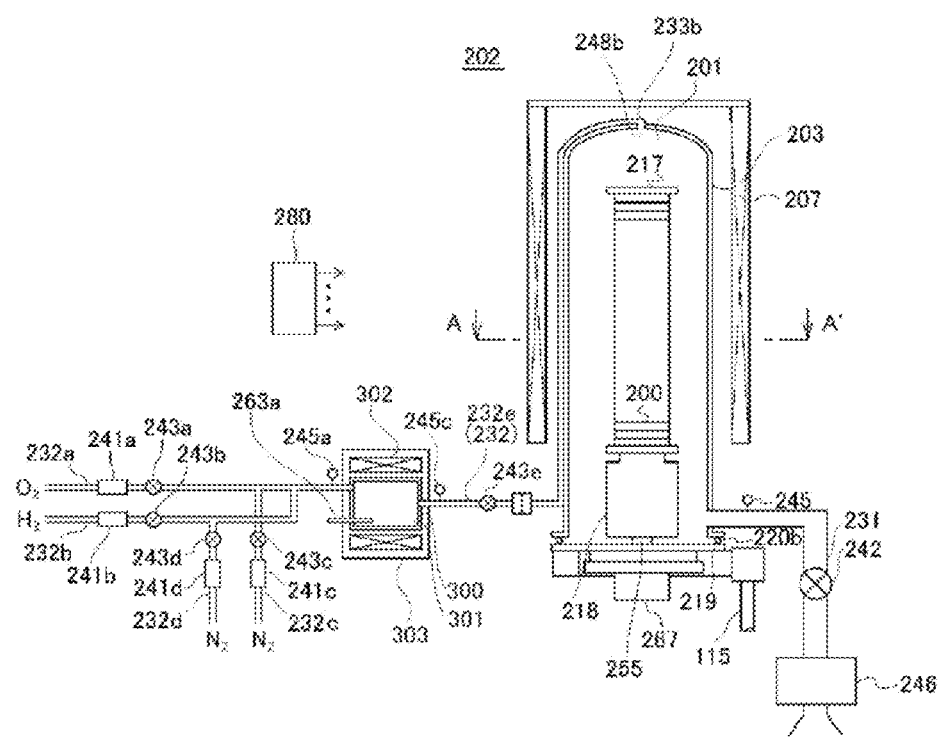
FIG. 9 is a schematic block diagram of the vertical-type processing furnace of the substrate processing apparatus according to a third modified example of an embodiment of the present invention, and is a view showing the processing furnace portion in a longitudinal sectional view.

In addition, in the above-mentioned second modified example, explanation is given for an example of supplying the reactive species generated in the pre-reaction chamber 301, into the process chamber 201 through the first nozzle 233a only. However, the reactive species generated in the pre-reaction chamber 301 may also be supplied into the process chamber 201 through the second nozzle 233b only. In this case, in the above-mentioned embodiment, the valve 243f of the reaction gas supply tube 232f is closed, and the valve 243e of the reaction gas supply tube 232e is opened. In this case, as shown in FIG. 9, the first nozzle 233a, the reaction gas supply tube 232f, and the valve 243f may be omitted (third modified example). In a case of the third modified example as well, the structure of the gas inlet part can be simplified. The third modified example is obtained by further modifying the first modified example. In the third modified example as well, the effect similar to the effects of the above-mentioned embodiment and the first modified example can be obtained. In FIG. 9, signs and numerals substantially same as those described in FIG. 6 and FIG. 7, are assigned to the same element, and explanation thereof is omitted.

Fourth Modified Example

Figure 10:
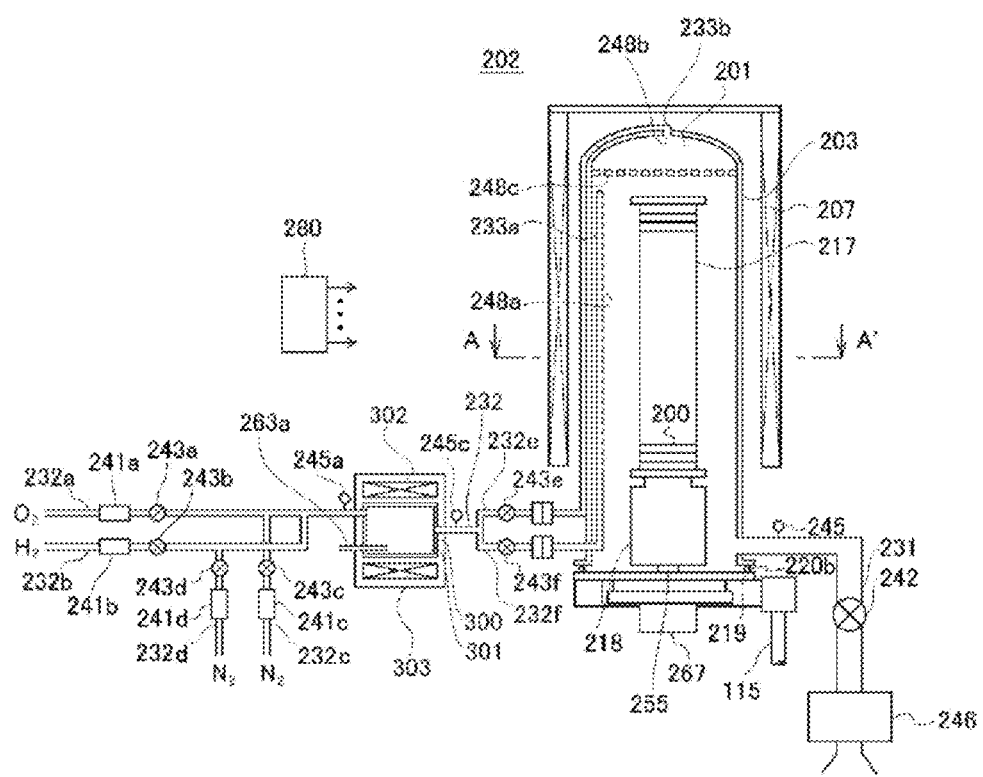
FIG. 10 is a schematic block diagram of the vertical-type processing furnace of the substrate processing apparatus according to a fourth modified example of an embodiment of the present invention, and is a view showing the processing furnace portion in a longitudinal sectional view.

In the above-mentioned embodiment and the first modified example, when the reactive species generated in the pre-reaction chamber 301 is supplied from one end side (upstream side) of the wafer arrangement region in the process chamber 201, namely from the upper part (ceiling part) of the process chamber 201, explanation is given for an example of supplying the reactive species into the process chamber 201 through the gas supply hole 248b of the second nozzle 233b. However, as shown in FIG. 10, it is also acceptable in the present invention, that the reactive species supplied from the upper part (ceiling part) of the process chamber 201, are supplied into the process chamber 201 through the gas supply hole 248b and a shower plate 248c (fourth modified example). A plurality of air vents are provided on the shower plate 248c of the fourth modified example, so that the reactive species or the $O_2$ gas or the $H_2$ gas is evenly dispersed, which are then supplied into the process chamber 201. In a case of the fourth modified example, the reactive species, the $O_2$ gas, and the Hz gas can be evenly supplied into the process chamber 201. The fourth modified example is obtained by further modifying the first modified example. In the fourth modified example as well, the effect similar to the effects of the above-mentioned embodiment and the first modified example can be obtained. In FIG. 10, signs and numerals substantially same as those described in FIG. 6 and FIG. 7, are assigned to the same element, and explanation thereof is omitted.

Fifth Modified Example

Figure 11:
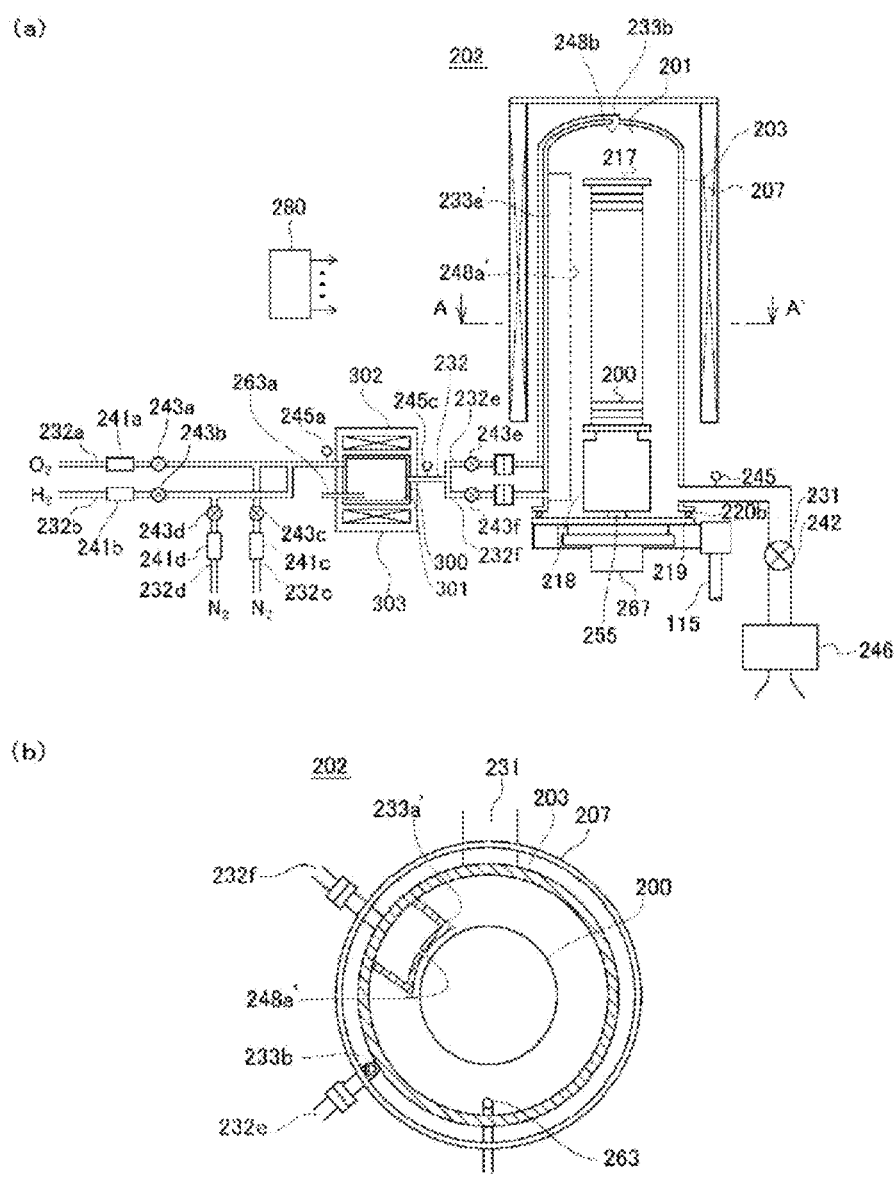

In the above-mentioned embodiment and the first modified example, explanation is given for an example of supplying the reactive species into the process chamber 201 through the first nozzle 233a and the gas supply holes 248a, when the reactive species generated in the pre-reaction chamber 301 are supplied from a region at the lateral side of the wafer arrangement region corresponding to the wafer arrangement region in the process chamber 201. However, as shown in FIG. 11, it is also acceptable in the present invention, that the reactive species supplied from the region at the lateral side of the wafer arrangement region, are supplied through a buffer chamber formed by a buffer tube 233a' (fifth modified example). The buffer tube 233a' of the fifth modified example, is provided in a part extending from a lower part to an upper part of the inner wall of the process tube 203, along the stacking direction of the wafers 200, in an arc-shaped space between the inner wall of the process tube 203 and the wafers 200. Gas supply holes 248' for supplying a gas are provided in a center part of a wall of the buffer tube 233a' adjacent to the wafers 200. The gas supply holes 248a' are opened to face the center of the process tube 203. The gas supply holes 248a' are provided extending from the lower part to the upper part of the process tube 203, each of them having the same opening area and provided at the same opening pitch. In a case of the fifth modified example, a volume in the buffer tube 233a' is formed larger than a volume in the first nozzle 233a, and therefore rise of the pressure in the buffer tube 233a' can be suppressed, and the deactivation of the reactive species in the buffer tube 233a' can be further suppressed. The fifth modified example is obtained by further modifying the first modified example. In the fifth modified example as well, the effect similar to the effects of the above-mentioned embodiment and the first modified example can be obtained. In FIG. 11, signs and numerals substantially same as those described in FIG. 6 and FIG. 7, are assigned to the same element, and explanation thereof is omitted.

Sixth Modified Example

Figure 12:
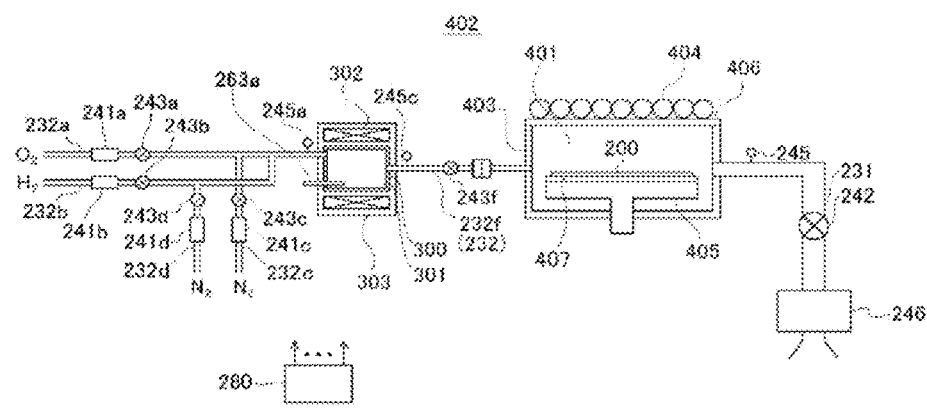
FIG. 12 is a schematic block diagram of a non batch-type processing furnace of the substrate processing apparatus according to a sixth modified example of an embodiment of the present invention, and is a view showing the processing furnace portion in a longitudinal sectional view.

Further, in the above-mentioned embodiment, explanation is given for the substrate processing apparatus having a batch-type hot wall processing furnace. However, the present invention is not limited to the substrate processing apparatus according to this embodiment, and can be suitably applied to a substrate processing apparatus having a non batch-type processing furnace, and a substrate processing apparatus having a cold wall type processing furnace. For example, as shown in FIG. 12, the present invention can be applied to a substrate processing apparatus in which a first heating source is not a resistance heating heater but a lamp heater, and the substrate processing apparatus having a non batch-type cold wall processing furnace for heating a wafer by an energy obtained by irradiating the wafer with a light from a lamp, namely by an energy obtained by light absorption into the wafer (sixth modified example). A processing furnace 402 of the sixth modified example includes a lamp 404 as a first heating source, a processing vessel 403 forming a process chamber 401, a quartz window 406 allowing a light from the lamp 404 to be transmitted therethrough, and a supporting table 405 having a susceptor 407 for supporting one slice of the wafer 200 in a horizontal posture.

According to the sixth modified example, by using the pre-reaction chamber 301 heated to a high temperature, the generation amount of the reactive species such as atomic oxygen (O), etc., can be increased, and the concentration of the reactive species can be remarkably increased. Therefore, even in a case of using the cold wall type chamber such as heating the wafer by light irradiation, the film quality can be improved in the low-temperature treatment, similarly to the high-temperature treatment, and the film formation rate can be improved similarly to the high-temperature treatment. Also, in a case of using the cold wall type chamber for heating the wafer by light irradiation, about 900° C. is a lower limit as the heating temperature of the wafer in the related art. However, according to the present invention, in the low-temperature treatment of not more than 900° C. as well, the film quality can be improved similarly to the oxidation treatment and the annealing performed at a temperature of 900° C. or more, and the film formation rate can also be improved. The sixth modified example is obtained by further modifying a portion of the processing furnace of the first modified example. In the sixth modified example as well, the effect similar to the effects of the above-mentioned embodiment and the first modified example can be obtained. In FIG. 12, signs and numerals substantially same as those described in FIG. 6 and FIG. 7, are assigned to the same element, and explanation thereof is omitted.

Seventh Modified Example

Figure 13:
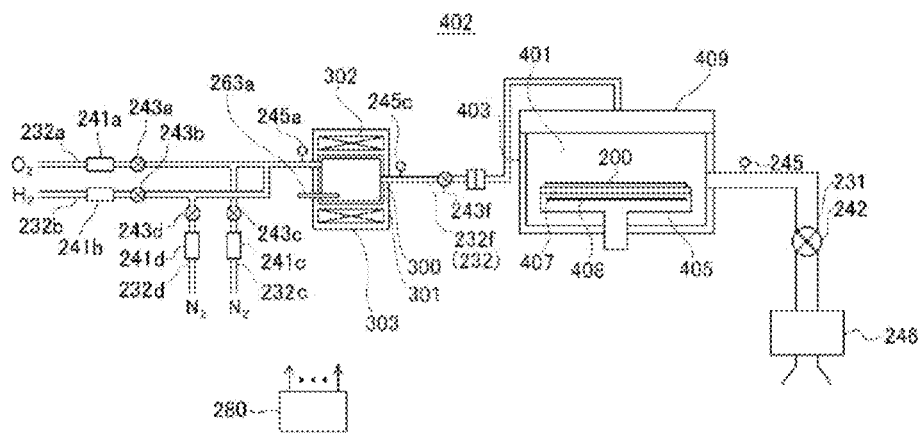
FIG. 13 is a schematic block diagram of the non batch-type processing furnace of the substrate processing apparatus according to a seventh modified example of an embodiment of the present invention, and is a view showing the processing furnace portion in a longitudinal sectional view.

In the above-mentioned sixth modified example, explanation is given for an example of applying the present invention to the substrate processing apparatus having a non batch-type cold wall processing furnace of a lamp heating system for directly heating the wafer using the lamp heater. However, the present invention can also be suitably applied to a substrate processing apparatus having a non batch-type cold wall processing furnace of a susceptor heating system for directly heating the wafer through the susceptor. For example, as shown in FIG. 13, the present invention can be applied to a substrate processing apparatus configured to have the first heating source provided as a resistance heating heater, and a non batch-type cold wall processing furnace for heating the wafer by heating the susceptor using the resistance heating heater and transmitting a heat from the heated susceptor (seventh modified example). The processing furnace 402 of the seventh modified example includes the processing vessel 403 that forms the process chamber 401, the supporting table 405 having the susceptor 407 for supporting one slice of the wafer 200 in a horizontal posture, a resistance heating heater 408 as the first heating source provided on the supporting table 405, and a shower head 409 for supplying a gas into the process chamber 401 in a shower form. It is also acceptable that the reaction gas supply tube 232 is directly connected to the ceiling part of the processing vessel 403 without providing the shower head 409, so that the gas is supplied into the process chamber 401 from one place of the ceiling part of the processing vessel 403. In the seventh modified example, the susceptor 407 is heated by the resistance heating heater 408, and the wafer 200 is heated by the heat transmitted from the heated susceptor 407. It is also acceptable that the lamp heater is used instead of the resistance heating heater 408, and the susceptor 407 is heated by the lamp heater, and the wafer 200 is heated by the heat transmitted from the heated susceptor 407.

According to the seventh modified example, by using the pre-reaction chamber 301 heated to a high temperature, the generation amount of the reactive species such as atomic oxygen (O), etc., can be increased and the concentration of the reactive species can be remarkably increased. Therefore, even in a case of using the cold wall type chamber for heating the wafer 200 by the heat transmitted from the susceptor 407 heated by the heater, the film quality can be improved in the low-temperature treatment similarly to the high-temperature treatment, and the film formation rate can be improved similarly to the high-temperature treatment. The seventh modified example is obtained by further modifying the portion of the processing furnace of the first modified example or the sixth modified example. In the seventh modified example as well, the effect similar to the effects of the above-mentioned embodiment and the first modified example can be obtained. In FIG. 13, signs and numerals substantially same as those described in FIG. 6, FIG. 7, and FIG. 12 are assigned to the same element, and explanation thereof is omitted.

Eighth Modified Example

Figure 14:
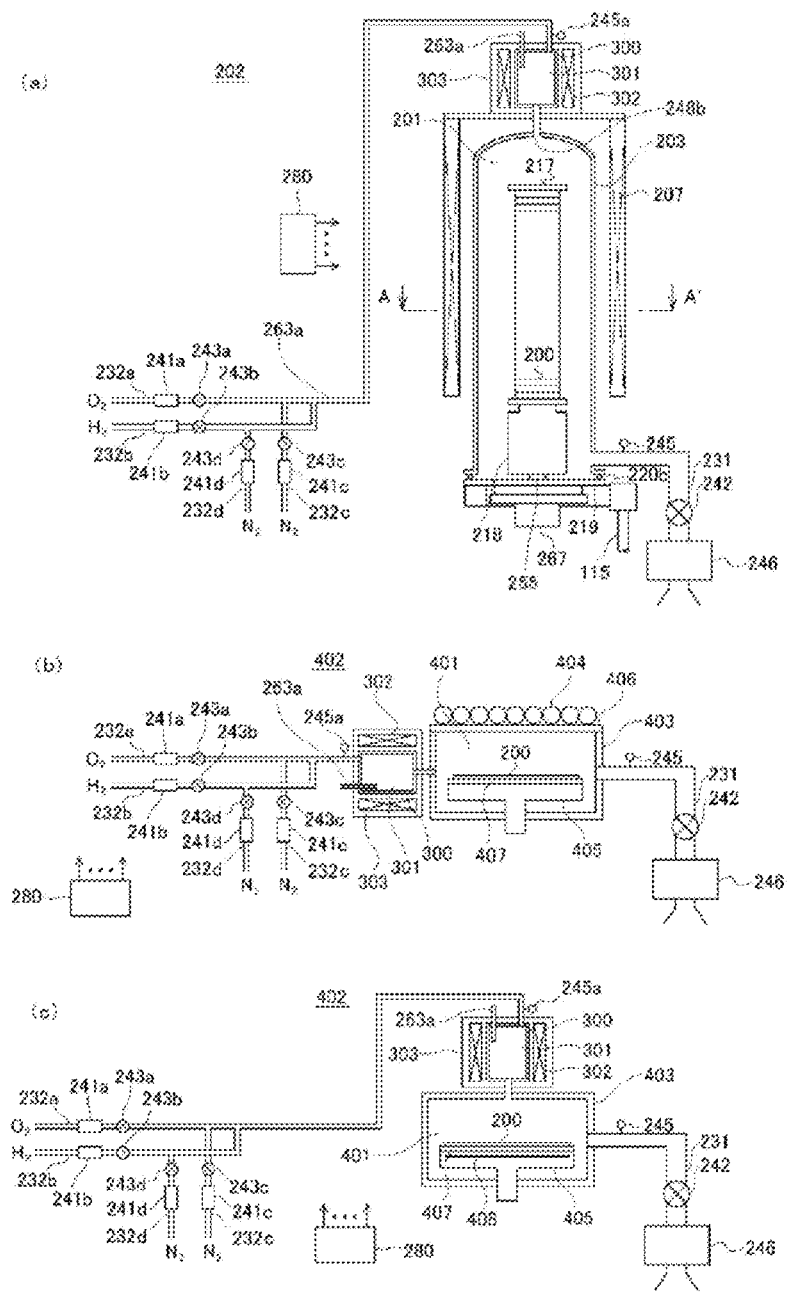

In the above-mentioned embodiment and each modified example, explanation is given for an example of using the substrate processing apparatus of a type in which the pre-reaction chamber 301 and the process chamber 201 (401) are connected to each other by the piping part. However, the present invention can also be suitably applied to a substrate processing apparatus of a type in which the pre-reaction chamber 301 and the process chamber 201 (401) are directly connected to each other. For example, as shown in FIG. 14, it is also acceptable that the piping part is eliminated, and the pre-reaction chamber 301 and the process chamber 201 (401) are directly connected to each other. In this case, the connection part between the pre-reaction chamber 301 and the process chamber 201 (401) is formed by a direct connection part between the pre-reaction chamber 301 and the process chamber 201 (401). FIG. 14(a) shows an example of the substrate processing apparatus of a type in which the pre-reaction chamber 301 and the process chamber 201 are directly connected to each other according to the third modified example. FIG. 14(b) shows an example of the substrate processing apparatus of a type in which the pre-reaction chamber 301 and the process chamber 401 are directly connected to each other according to the sixth modified example. FIG. 14(c) shows an example of the substrate processing apparatus of a type in which the pre-reaction chamber 301 and the process chamber 401 are directly connected to each other according to the seventh modified example. FIG. 14(c) shows an example of supplying a gas into the process chamber 401 from one place of the ceiling part of the processing vessel 403, by directly connecting the pre-reaction vessel 300 (pre-reaction chamber 301) to the ceiling part of the processing vessel 403, without providing the shower head 409.

According to the eighth modified example, the piping part for connecting the pre-reaction chamber 301 and the process chamber 201 (401) is eliminated, so that the pre-reaction chamber 301 and the process chamber 201 (401) are directly connected to each other, and therefore the deactivation of the reactive species in the piping part can be prevented, wherein the reactive species such as atomic oxygen (O), etc., are generated in the pre-reaction chamber 301. Namely, the reactive species such as atomic oxygen (O), etc., generated in the pre-reaction chamber 301 can be directly introduced into the process chamber 201 (401) without deactivating the reactive species such as atomic oxygen (O), etc., generated in the pre-reaction chamber 301. Moreover, since the piping part is eliminated, pressure monitoring in the piping part and pressure control in the piping part can be eliminated, so that the structure of the substrate processing apparatus and a pressure control operation can be simplified.

The embodiment and each modified example of the present invention are specifically described above. However, the present invention is not limited to the above-mentioned embodiment and each modified example, and can also be applied to an embodiment in which the above-mentioned embodiment and each modified example are suitably combined.

Further, in the above-mentioned embodiment and each modified example, explanation is given for an example of setting the second temperature to be higher than the first temperature (second temperature>first temperature). However, the second temperature can be equal to the first temperature (second temperature=first temperature). Namely, the temperature in the re-reaction chamber and the temperature in the process chamber can be equal to each other.

For example, in this case, both the temperature in the pre-reaction chamber and the temperature in the process chamber are set to the first temperature, and the reaction is induced between the oxygen-containing gas and the hydrogen-containing gas are started in the pre-reaction chamber heated to the first temperature and set in a decompressed state, and the reaction can be accelerated in the process chamber heated to the first temperature and set in the decompressed state, so that the concentration of the atomic oxygen obtained at this temperature can be maximum. In this case, the reaction between the oxygen-containing gas and the hydrogen-containing gas is not started in the process chamber, but is started in the pre-reaction chamber, and the pre-reaction chamber functions as a buffer of adjusting a delay time in the reaction between the oxygen-containing gas and the hydrogen-containing gas.

Thus, even if the second temperature is set to be equal to the first temperature, the delay time in the reaction between the oxygen-containing gas and the hydrogen-containing gas in a low temperature region can be improved. Namely, the delay time in the reaction between the oxygen-containing gas and the hydrogen-containing gas in the low temperature region can be improved by not only setting the second temperature to a temperature higher than the first temperature (second temperature>first temperature), but also setting the second temperature to be equal to the first temperature (second temperature=first temperature), namely setting the second temperature to be a temperature not less than the first temperature (second temperature≥first temperature).

Example

Figure 5:
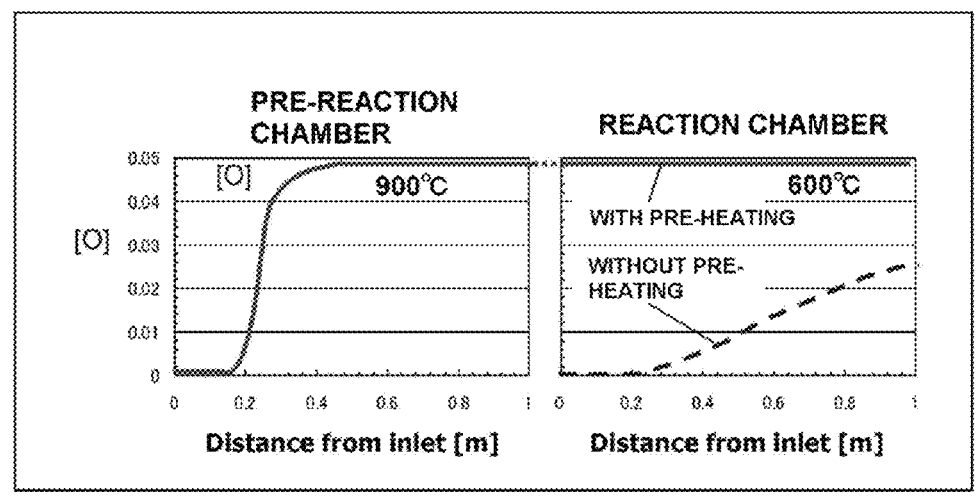
FIG. 5 is a view showing an amount of the atomic oxygen when pre-heating is performed, and when pre-heating is not performed in a pre-reaction chamber.

When the oxidation treatment is applied to the wafer using the above-mentioned substrate processing apparatus, the generation amount of the atomic oxygen (O) being the reactive species in the process chamber, was obtained by a CFD analysis, in a case that the $O_2$ gas and the $H_2$ gas were pre-heated under the decompression atmosphere so that a reaction was induced between them in the per-reaction chamber, to thereby generate the reactive species, which were then supplied into the process chamber under the decompression state (in a case of "with pre-heating"), and in a case that the $O_2$ gas and the $H_2$ gas were directly supplied into the process chamber under the decompression state without pre-heating them (in a case of "without pre-heating"). Wherein, the temperature and the pressure in the pre-reaction chamber were set to 900° C. and 60 Pa respectively, and the temperature and the pressure in the process chamber were set to 600° C. and 60 Pa respectively. FIG. 5 shows a result of the CFD analysis. The left side of FIG. 5 shows the generation amount of the atomic oxygen (O) in the pre-reaction chamber in the case of "with pre-heating", and the right side of FIG. 5 shows the generation amount of the atomic oxygen (O) in the process chamber in the case of "with pre-heating" and in the case of "without pre-heating". A distance (the same meaning as a gas residence time) from Inlet (a gas supply port for supplying gas into the pre-reaction chamber) is taken on the horizontal axis in the left-side figure of FIG. 5, and a molar fraction of the atomic oxygen (O) is taken on the vertical axis. Further, a distance (the same meaning as the gas residence time) from the Inlet (the gas supply port for supplying gas into the process chamber) is taken on the horizontal axis in the right-side figure of FIG. 5, and the molar fraction of the atomic oxygen (O) is taken on the vertical axis.

It is found from FIG. 5, that an absolute amount of the atomic oxygen (O) introduced into the process chamber is increased in the case of "with pre-heating", compared with a case of "without pre-heating". This reveals that a high oxidizing power can be obtained even when wafer processing is performed at a low temperature.

Preferred aspects of the present invention will be supplementarily described hereafter.

According to an aspect of the present invention, there is provided a substrate processing apparatus, including:
a process chamber configured to house a substrate therein;
a first heating source configured to heat a substrate in the process chamber to a first temperature;
a pre-reaction chamber in which a reaction is induced among a plurality of kinds of gases;
a second heating source configured to heat the pre-reaction chamber to a second temperature;
an oxygen-containing gas supply system configured to supply an oxygen-containing gas into the pre-reaction chamber;
a hydrogen-containing gas supply system configured to supply a hydrogen-containing gas into the pre-reaction chamber;
a connection part configured to connect the pre-reaction chamber and the process chamber;
a pressure adjusting part configured to adjust a pressure in the process chamber and the pre-reaction chamber to a pressure of less than an atmospheric pressure; and
a control part configured to control the first heating source, the second heating source, the oxygen-containing gas supply system, the hydrogen-containing gas supply system, and the pressure adjusting part, so that the oxygen-containing gas and the hydrogen-containing gas are supplied into the pre-reaction chamber heated to the second temperature and having the pressure set to less than the atmospheric pressure, and a reaction is induced between both gases in the pre-reaction chamber to generate reactive species, and the reactive species are supplied into the process chamber in which a substrate heated to the first temperature is housed, and the pressure is set to less than the atmospheric pressure, and processing is applied to the substrate by the reactive species, with the second temperature set to be not less than the first temperature at this time.

Preferably, there are further provided a first pressure detector configured to detect a pressure in the process chamber; and a second pressure detector configured to detect a pressure in the pre-reaction chamber.

Further preferably, the control part is further configured to control the pressure adjusting part and the hydrogen-containing gas supply system so that the hydrogen-containing gas is allowed to be supplied into the pre-reaction chamber in a case that the pressure in the pre-reaction chamber is maintained to a specific pressure, and the hydrogen-containing gas is not allowed to be supplied into the pre-reaction chamber in a case that the pressure in the pre-reaction chamber exceeds the specific pressure, when processing is applied to the substrate.

Further preferably, the specific pressure is 3999 Pa or less.

Further preferably, the control part is further configured to control the pressure adjusting part, the hydrogen-containing gas supply system, and the oxygen-containing gas supply system, so that the hydrogen-containing gas and the oxygen-containing gas are allowed to be supplied into the pre-reaction chamber in a case that the pressure in the pre-reaction chamber is maintained to a specific pressure, and the hydrogen-containing gas and the oxygen-containing gas are not allowed to be supplied into the pre-reaction chamber in a case that the pressure in the pre-reaction chamber exceeds the specific pressure, when processing is applied to the substrate.

Further preferably, the specific pressure is 3999 Pa or less.

Further preferably, when the control part is further configured to control the pressure adjusting part so that the pressure in the connection part becomes a pressure of less than the atmospheric pressure, when processing is applied to the substrate.

Further preferably, the control part is further configured to control the pressure adjusting part so that the pressure in the pre-reaction chamber becomes a pressure of 1 Pa or more and 3999 Pa or less, when processing is applied to the substrate.

Further preferably, the control part is further configured to control the pressure adjusting part so that the pressure in the pre-reaction chamber becomes 1 Pa or more and 2666 Pa or less, when processing is applied to the substrate.

Further preferably, the control part is further configured to control the pressure adjusting part so that the pressure in the pre-reaction chamber becomes 1 Pa or more and 1333 Pa or less, when processing is applied to the substrate.

Further preferably, the control part is configured to control the first heating source and the second heating source so that the second temperature is set to be higher than the first temperature.

Further preferably, the control part is further configured to control the first heating source and the second heating source so that the first temperature is set to a room temperature or more and 900° C. or less, and the second temperature is set to 400° C. or more and 1200° C. or less.

Further preferably, the control part is further configured to control the first heating source and the second heating source so that the first temperature is set to 200° C. or more and 600° C. or less, and the second temperature is set to 600° C. or more and 1000° C. or less.

Further preferably, the first heating source is a resistance heating heater.

Further preferably, the first heating source is a lamp heater.

According to the present invention, there is provided a method of processing a substrate, including:
heating a substrate housed in a process chamber to a first temperature; and
supplying an oxygen-containing gas and a hydrogen-containing gas into a pre-reaction chamber heated to a second temperature being the temperature of not less than the first temperature and having a pressure set to less than an atmospheric pressure, and inducing a reaction between both gases in the pre-reaction chamber to generate reactive species, and supplying the reactive species into the process chamber in which the substrate heated to the first temperature is housed and the pressure is set to less than the atmospheric pressure, and applying processing to the substrate by the reactive species.

According to further other aspect of the present invention, there is provided a method of manufacturing a semiconductor device, including:

heating a substrate housed in a process chamber to a first temperature; and supplying an oxygen-containing gas and a hydrogen-containing gas into a pre-reaction chamber heated to a second temperature being the temperature of not less than the first temperature and having a pressure set to less than an atmospheric pressure, and inducing a reaction between both gases in the pre-reaction chamber to generate reactive species, and supplying the reactive species into the process chamber in which the substrate heated to the first temperature is housed and the pressure is set to less than the atmospheric pressure, and applying processing to the substrate by the reactive species.

Preferably, the processing is an oxidation treatment applied to the substrate.

Further preferably, the processing is an annealing applied to an insulating film formed on the substrate.

Further preferably, the processing is a modification treatment applied to an insulating film formed on the substrate.

Further preferably, the oxygen-containing gas is at least a gas selected from a group consisting of an oxygen gas, an ozone gas, a nitric monoxide gas, and a nitrous oxide gas, and the hydrogen-containing gas is at least a gas selected from a group consisting of a hydrogen gas, a heavy hydrogen gas, an ammonia gas, and a methane gas.

Further preferably, the oxygen-containing gas is an oxygen gas, and the hydrogen-containing gas is a hydrogen gas.

According to further other aspect of the present invention, there is provided a program that causes a computer to perform:

a procedure of heating a substrate housed in a process chamber of a substrate processing apparatus, to a first temperature; and a procedure of supplying an oxygen-containing gas and a hydrogen-containing gas into a pre-reaction chamber heated to a second temperature being the temperature of not less than the first temperature and having a pressure set to less than an atmospheric pressure, and inducing a reaction between both gases in the pre-reaction chamber to generate reactive species, and supplying the reactive species into the process chamber in which the substrate heated to the first temperature is housed and the pressure is set to less than the atmospheric pressure, and applying processing to the substrate by the reactive species.

According to further other aspect of the present invention, there is provided a non-transitory computer-readable recording medium recording a program that causes a computer to perform:

a procedure of heating a substrate housed in a process chamber of a substrate processing apparatus, to a first temperature; and a procedure of supplying an oxygen-containing gas and a hydrogen-containing gas into a pre-reaction chamber heated to a second temperature being the temperature of not less than the first temperature and having a pressure set to less than an atmospheric pressure, and inducing a reaction between both gases in the pre-reaction chamber to generate reactive species, and supplying the reactive species into the process chamber in which the substrate heated to the first temperature is housed and the pressure is set to less than the atmospheric pressure, and applying processing to the substrate by the reactive species.

DESCRIPTION OF SIGNS AND NUMERALS

200 Wafer
201 Process chamber
202 Processing furnace
203 Reaction tube
207 First heater
231 Exhaust tube
232 Reaction gas supply tube
232a First gas supply tube
232b Second gas supply tube
232c First inert gas supply tube
232d Second inert gas supply tube
232e Reaction gas supply tube
232f Reaction gas supply tube
233a First nozzle
233b Second nozzle
241a Mass flow controller
241b Mass flow controller
241c Mass flow controller
241d Mass flow controller
242 APC valve
245 Pressure sensor
245a Pressure sensor
245b Pressure sensor
245c Pressure sensor
246 Vacuum pump
263 Temperature sensor
263a Temperature sensor
280 Controller
300 Pre-reaction vessel
301 Pre-reaction chamber
302 Second heater

The invention claimed is:

1. A substrate processing apparatus, comprising:
a process chamber configured to house a substrate therein;
a first heating source configured to heat a substrate in the process chamber to a first temperature;
a pre-reaction chamber in which a reaction is induced among a plurality of kinds of gases;
a second heating source configured to heat the pre-reaction chamber to a second temperature;
an oxygen-containing gas supply system configured to supply an oxygen-containing gas into the pre-reaction chamber;
a hydrogen-containing gas supply system configured to supply a hydrogen-containing gas into the pre-reaction chamber;
a connection part configured to connect the pre-reaction chamber and the process chamber;
a pressure adjusting part configured to adjust a pressure in the process chamber and the pre-reaction chamber to a pressure of less than an atmospheric pressure; and
a control part configured to control the first heating source, the second heating source, the oxygen-containing gas supply system, the hydrogen-containing gas supply system, and the pressure adjusting part, so that the oxygen-containing gas and the hydrogen-containing gas are supplied into the pre-reaction chamber heated to the second temperature and having the pressure set to less than the atmospheric pressure, and a reaction is induced between both gases in the pre-reaction chamber to generate reactive species, and the reactive species are supplied into the process chamber in which a substrate heated to the first temperature is housed and the pressure is set to less than the atmospheric pressure, and processing is applied to the substrate by the reactive species, with the second temperature set to be not less than the first temperature at this time.

2. The substrate processing apparatus according to claim 1, further comprising:
   a first pressure detector configured to detect a pressure in the process chamber; and
   a second pressure detector configured to detect a pressure in the pre-reaction chamber.

3. The substrate processing apparatus according to claim 2, wherein the control part is further configured to control the pressure adjusting part and the hydrogen-containing gas supply system so that the hydrogen-containing gas is allowed to be supplied into the pre-reaction chamber in a case that the pressure in the pre-reaction chamber is maintained to a specific pressure, and the hydrogen-containing gas is not allowed to be supplied into the pre-reaction chamber in a case that the pressure in the pre-reaction chamber exceeds the specific pressure, when processing is applied to the substrate.

4. The substrate processing apparatus according to claim 3, wherein the specific pressure is 3999 Pa or less.

5. The substrate processing apparatus according to claim 2, wherein the control part is further configured to control the pressure adjusting part, the hydrogen-containing gas supply system, and the oxygen-containing gas supply system, so that the hydrogen-containing gas and the oxygen-containing gas are allowed to be supplied into the pre-reaction chamber in a case that the pressure in the pre-reaction chamber is maintained to a specific pressure, and the hydrogen-containing gas and the oxygen-containing gas are not allowed to be supplied into the pre-reaction chamber in a case that the pressure in the pre-reaction chamber exceeds the specific pressure, when processing is applied to the substrate.

6. The substrate processing apparatus according to claim 5, wherein the specific pressure is 3999 Pa or less.

7. The substrate processing apparatus according to claim 2, wherein the control part is further configured to control the pressure adjusting part so that the pressure in the connection part becomes a pressure of less than the atmospheric pressure, when processing is applied to the substrate.

8. The substrate processing apparatus according to claim 1, wherein the control part is further configured to control the pressure adjusting part so that the pressure in the pre-reaction chamber becomes a pressure of 1 Pa or more and 3999 Pa or less, when processing is applied to the substrate.

9. The substrate processing apparatus according to claim 1, wherein the control part is configured to control the first heating source and the second heating source so that the second temperature is set to be higher than the first temperature.

10. The substrate processing apparatus according to claim 1, wherein the control part is further configured to control the first heating source and the second heating source so that the first temperature is set to a room temperature or more and 90° C. or less, and the second temperature is set to 400° C. or more and 1200° C. or less.

11. The substrate processing apparatus according to claim 1, wherein the control part is further configured to control the first heating source and the second heating source so that the first temperature is set to 200° C. or more and 600° C. or less, and the second temperature is set to 600° C. or more and 1000° C. or less.

12. The substrate processing apparatus according to claim 1, wherein the first heating source is a resistance heating heater.

13. The substrate processing apparatus according to claim 1, wherein the first heating source is a lamp heater.

14. A method of processing a substrate, comprising:
   heating a substrate housed in a process chamber to a first temperature; and
   supplying an oxygen-containing gas and a hydrogen-containing gas into a pre-reaction chamber heated to a second temperature being the temperature of not less than the first temperature and having a pressure set to less than an atmospheric pressure, and inducing a reaction between both gases in the pre-reaction chamber to generate reactive species, and supplying the reactive species into the process chamber in which the substrate heated to the first temperature is housed and the pressure is set to less than the atmospheric pressure, and applying processing to the substrate by the reactive species.

15. A method of manufacturing a semiconductor device, comprising:
   heating a substrate housed in a process chamber to a first temperature; and
   supplying an oxygen-containing gas and a hydrogen-containing gas into a pre-reaction chamber heated to a second temperature being the temperature of not less than the first temperature and having a pressure set to less than an atmospheric pressure, and inducing a reaction between both gases in the pre-reaction chamber to generate reactive species, and supplying the reactive species into the process chamber in which the substrate heated to the first temperature is housed and the pressure is set to less than the atmospheric pressure, and applying processing to the substrate by the reactive species.

* * * * *